United States Patent
Nagai

(10) Patent No.: US 8,107,203 B2
(45) Date of Patent: Jan. 31, 2012

(54) ELECTROSTATIC DISCHARGE PROTECTION DEVICE

(75) Inventor: Takayuki Nagai, Kanagawa (JP)

(73) Assignee: Renesas Electronics Corporation, Kawasaki-shi, Kanagawa (JP)

( * ) Notice: Subject to any disclaimer, the term of this patent is extended or adjusted under 35 U.S.C. 154(b) by 1031 days.

(21) Appl. No.: 11/806,962

(22) Filed: Jun. 5, 2007

(65) Prior Publication Data

US 2007/0284665 A1 Dec. 13, 2007

(30) Foreign Application Priority Data

Jun. 12, 2006 (JP) ................................ 2006-162002

(51) Int. Cl.
*H02H 9/04* (2006.01)
*H01L 23/60* (2006.01)

(52) U.S. Cl. ........... 361/56; 361/111; 257/355; 257/173

(58) Field of Classification Search ............. 361/56, 361/111; 275/355, 173
See application file for complete search history.

(56) References Cited

U.S. PATENT DOCUMENTS

| | | | | | |
|---|---|---|---|---|---|
| 3,914,749 | A | * | 10/1975 | Malaviya | 365/186 |
| 4,484,388 | A | * | 11/1984 | Iwasaki | 438/207 |
| 5,583,363 | A | * | 12/1996 | Momose et al. | 257/378 |
| 5,705,841 | A | * | 1/1998 | Yu | 257/355 |
| 6,392,275 | B1 | * | 5/2002 | Jang | 257/343 |
| 6,777,723 | B1 | * | 8/2004 | Narita | 257/173 |
| 7,242,561 | B2 | * | 7/2007 | Ker et al. | 361/56 |
| 7,304,334 | B2 | * | 12/2007 | Agarwal et al. | 257/197 |

FOREIGN PATENT DOCUMENTS

| JP | 2003-203985 | 7/2003 |
|---|---|---|
| JP | 2005-268379 | 9/2005 |

OTHER PUBLICATIONS

High Performance PNP and NPN Bipolar Chip, IBM Technical Disclosure Bulletin NB80123232, Dec. 1, 1980, IBM, vol. 23, Issue No. 7B.*
Japanese Office action dated Apr. 22, 2008 with a partial English translation.

* cited by examiner

*Primary Examiner* — Rexford Barnie
*Assistant Examiner* — Zeev V Kitov
(74) *Attorney, Agent, or Firm* — McGinn Intellectual Property Law Group, PLLC

(57) ABSTRACT

According to an embodiment of the present invention, an electrostatic discharge protection circuit used for a semiconductor device including a first power supply terminal, a second power supply terminal, and an input/output terminal, includes: a thyristor passing a surge current from the input/output terminal to the second power supply terminal; and a bipolar transistor passing a surge current from the first power supply terminal to the input/output terminal.

15 Claims, 20 Drawing Sheets

ELECTROSTATIC DISCHARGE PROTECTION DEVICE

BACKGROUND OF THE INVENTION

1. Field of the Invention

The present invention relates to an electrostatic discharge protection device. In particular, the invention relates to an electrostatic discharge protection device for discharging a current flowing due to static charges impressed to an external terminal of a semiconductor device through an electrostatic discharge protection element.

2. Description of Related Art

If static charges are impressed to a terminal of a semiconductor device, an abnormal current (hereinafter referred to as "surge current") flows through a circuit due to the static charges. If the surge current is generated, there is a fear that an internal circuit is broken down. The breakdown resulting from the electrostatic charges is hereinafter referred to as "electrostatic breakdown".

To prevent the electrostatic breakdown, general semiconductor devices incorporate an electrostatic discharge protection device. Japanese Unexamined Patent Application Publication No. 2003-203985 discloses an example of an electrostatic discharge protection device.

FIG. 25 is a circuit diagram of an electrostatic discharge protection device 100 as disclosed in Japanese Unexamined Patent Application Publication No. 2003-203985. As shown in FIG. 25, the electrostatic discharge protection device 100 of the related art includes a PNP transistor 101, an NPN transistor 102, an diode-connected NMOS transistor 104, an input/output terminal (I/O terminal), a power supply terminal (VDD terminal), and a ground terminal (GND terminal). The I/O terminal is an input/output terminal of a semiconductor device. The terminal is connected with an internal circuit. The PNP transistor 101 has a collector connected with a GND terminal through a resistor Rpw, an emitter connected with the I/O terminal, and a base connected with a VDD terminal through a resistor Rnw. The NPN transistor 102 has a collector connected with the base of the PNP transistor 101, an emitter connected with the GND terminal, and a base connected with the collector of the PNP transistor.

The NMOS transistor 104 has a source connected with the GND terminal, a drain connected with the VDD terminal, and a gate connected with the source. That is, in the electrostatic discharge protection device of the related art, the PNP transistor 101 and the NPN transistor 102 constitute a thyristor.

Description is made of how the electrostatic discharge protection device 100 protects an internal circuit against breakdown. Electrostatic charges are impressed to the I/O terminal. On the assumption that a potential level of the VDD terminal is used as the reference, if positive electrostatic charges are impressed (VDD+ impressed), a parasitic diode of the PNP transistor 101 is forward-biased, and then a surge current flows into the VDD terminal.

If positive electrostatic charges are impressed based on the potential level of the GND terminal (GND+ impressed), the breakdown of the diode-connected NMOS transistor occurs, and the thyristor is turned on. As a result, a surge current flows into the GND terminal.

The electrostatic discharge protection device 100 protects the internal circuit from breakdown by discharging the surge current through the above path.

However, in the electrostatic discharge protection device 100 of the related art, it is difficult to protect the circuit if negative electrostatic charges are impressed. In addition, if a breakdown path at the PN junction of the transistor is used as the surge current path, there is a fear that enough current cannot flow and the semiconductor device is broken down.

SUMMARY

According to a first aspect of the present invention, an electrostatic discharge protection circuit used for a semiconductor device including a first power supply terminal, a second power supply terminal, and an input/output terminal, includes: a thyristor passing a surge current from the input/output terminal to the second power supply terminal; and a bipolar transistor passing a surge current from the first power supply terminal to the input/output terminal.

An electrostatic discharge protection circuit according to a second aspect of the invention includes: a first bipolar transistor including one terminal connected with a first power supply terminal, the other terminal connected with an input/output terminal, and a control terminal connected with a second power supply terminal; and a thyristor including one terminal connected with the input/output terminal, the other terminal connected with the second power supply terminal, and a control terminal connected with the first power supply terminal.

According to the present invention, a larger surge current can be discharged if electrostatic charges are impressed.

BRIEF DESCRIPTION OF THE DRAWINGS

The above and other objects, advantages and features of the present invention will be more apparent from the following description of certain preferred embodiments taken in conjunction with the accompanying drawings, in which.

DETAILED DESCRIPTION OF THE PREFERRED EMBODIMENTS

The invention will be now described herein with reference to illustrative embodiments. Those skilled in the art will recognize that many alternative embodiments can be accomplished using the teachings of the present invention and that the invention is not limited to the embodiments illustrated for explanatory purposes.

First Embodiment

Figure 1:
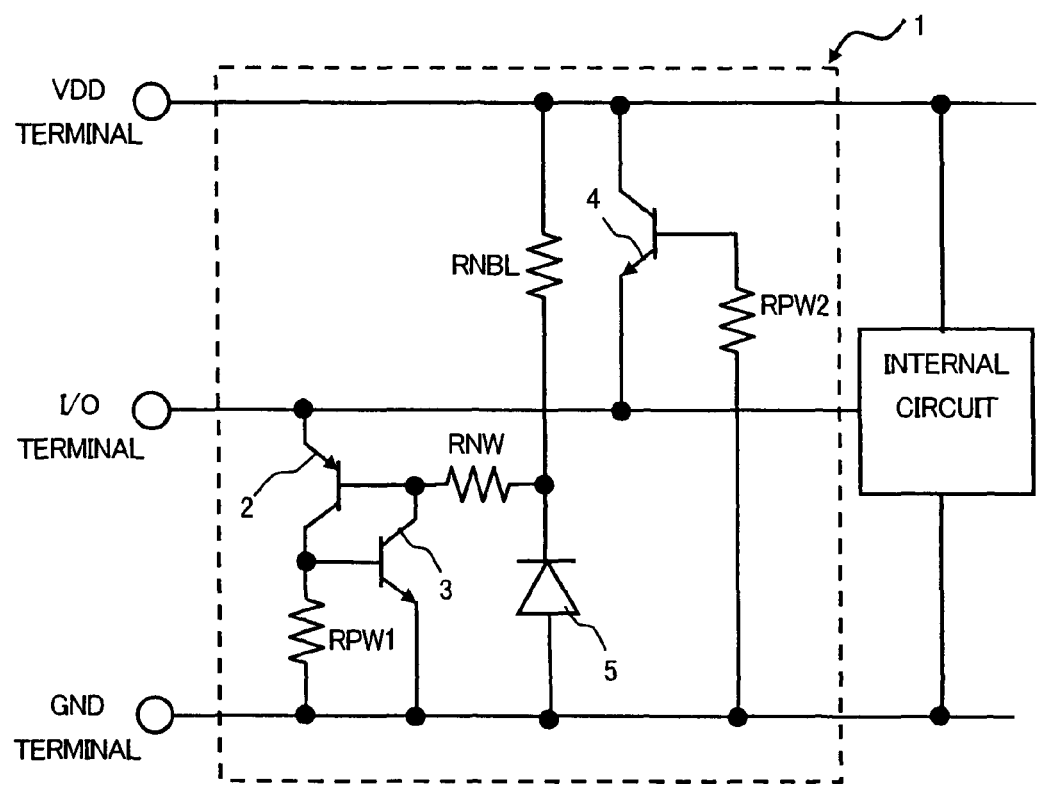
FIG. 1 is a circuit diagram of an electrostatic discharge protection circuit according to a first embodiment of the present invention.

Hereinafter, embodiments of the present invention are described with reference to the accompanying drawings. FIG. 1 is a circuit diagram of an electrostatic discharge protection device according to a first embodiment of the present invention. As shown in FIG. 1, the electrostatic discharge protection device 1 of the first embodiment includes a PNP transistor (second bipolar transistor) 2, an NPN transistor (third bipolar transistor) 3, an NPN transistor (first bipolar transistor) 4, and a diode (trigger element) 5. Further, the electrostatic discharge protection device 1 includes a first power supply terminal (hereinafter referred to as "VDD terminal"), an input/output terminal (hereinafter referred to as "I/O terminal"), and a second power supply terminal (hereinafter referred to as "GND terminal"). The I/O terminal is connected with an internal circuit of the semiconductor device. The internal circuit is a circuit including an NMOS transistor and a PMOS transistor, for instance.

The PNP transistor 2 has a collector connected with the GND terminal through a resistor RPW1, an emitter connected with the I/O terminal, and a base connected with the VDD terminal through resistors RNW and RNBL. The NPN transistor 3 has a collector connected with the base of the PNP transistor 2, an emitter connected with the GND terminal, and a base connected with the collector of the PNP transistor 2.

In this embodiment, the PNP transistor 2 and the NPN transistor 3 constitute a thyristor. The diode 5 has an anode connected with the GND terminal and a cathode connected with the base of the PNP transistor 2 and the VDD terminal. The diode 5 triggers turn-on of the thyristor composed of the PNP transistor 2 and the NPN transistor 3.

The NPN transistor 4 has a collector connected with the VDD terminal, an emitter connected with the I/O terminal, and a base connected with the GND terminal through the resistor RPW2.

Operations of the electrostatic discharge protection device 1 of the first embodiment are described next. First, normal operations of the semiconductor device are described. In this case, a ground voltage is applied to the GND terminal, and a voltage of about 3.3 V is applied to the VDD terminal, for example. Further, data signals are input/output to/from the I/O terminal. Under normal operations, a data signal voltage the amplitude between the ground voltage level and the power supply voltage level. Here, if a voltage of the I/O terminal is at the ground voltage level, the emitter terminal of the PNP transistor 2 is at the ground voltage level, and the base terminal is at the power supply voltage level, so the PNP transistor 2 does not operate. Further, the emitter terminal of the NPN transistor 3 is at the ground voltage level, and the base terminal is at the ground voltage level, so the NPN transistor 3 does not operate. The trigger diode is not applied with a voltage equal to or higher than a breakdown voltage, and the thyristor is not turned on.

Further, the emitter terminal of the NPN transistor 4 is at the ground voltage level, and the base terminal is at the ground voltage level, so the NPN transistor 3 does not operate.

On the other hand, the I/O terminal is at the power supply voltage level, the emitter terminal of the PNP transistor 2 is at the power supply voltage level, and the base terminal is at the power supply voltage level, so the PNP transistor 2 does not operate. Further, the emitter terminal of the NPN transistor 3 is at the ground voltage level, so the base terminal is at the ground voltage, so the NPN transistor 3 does not operate. The trigger diode is not applied with a voltage equal to or higher than a breakdown voltage, so the thyristor is not turned on.

The emitter terminal of the NPN transistor 4 is at the power supply voltage level, and the base terminal is at the ground voltage level, so the NPN transistor 4 does not operate.

That is, under normal operations of the semiconductor device, the electrostatic discharge protection device 1 does not operate, so there is no influence on ordinary operations of the semiconductor device.

Next, description is given of operations of the electrostatic discharge protection device 1 at the time of applying electrostatic charges to the semiconductor device. The electrostatic charges are impressed to the I/O terminal as positive or negative charges based on the potential level of the VDD terminal or GND terminal. For example, if positive electrostatic charges are impressed to the GND terminal, a voltage of the I/O terminal is higher than a voltage of the GND terminal (hereinafter this condition is referred to as "GND+ condition"). If negative electrostatic charges are impressed to the GND terminal, a voltage of the I/O terminal is lower than a voltage of the GND terminal (hereinafter this condition is referred to as "GND− condition"). If positive electrostatic charges are impressed to the VDD terminal, a voltage of the I/O terminal is higher than a voltage of the VDD terminal (hereinafter this condition is referred to as "VDD+ condition"). If negative electrostatic charges are impressed to the VDD terminal, a voltage of the I/O terminal is lower than a voltage of the GND terminal (hereinafter this condition is referred to as "VDD− condition").

In the electrostatic discharge protection device 1 of this embodiment, if the I/O terminal is impressed with electrostatic charges under the GND+ condition, the thyristor is turned on to release a surge current. If the terminal is impressed with electrostatic charges under the GND− condition, a surge current is released in accordance with forward-bias current in a parasitic diode formed in the NPN transistor 4. Further, in the electrostatic discharge protection device 1, the I/O terminal is impressed with electrostatic charges under the VDD+ conditions, a surge current is released in accordance with forward bias current in a parasitic diode of the PNP transistor 2 in the thyristor. If the terminal is impressed with electrostatic charges under the VDD− conditions, a surge current is released based on the snap back operation of the NPN transistor 4.

First, a turn-on operation of the thyristor is described. If a predetermined voltage or higher is applied to the diode 5, the diode 5 is broken down. As a result, base current flows through the PNP transistor 2, the PNP transistor 2 is turned on. After the PNP transistor 2 is turned on, the base current is supplied to the NPN transistor 3 as well, and the NPN transistor 3 is turned on. The I/O terminal and the GND terminal is electrically connected through these steps, and this operation is the turn-on operation of the thyristor.

On the other hand, breakdown occurs even in the parasitic diode formed in the NPN transistor 4 under a reversely-biased state that a cathode voltage is higher than an anode voltage, if a reverse-bias voltage is increased, and in some cases, a current flows from the cathode to the anode. However, an on-resistance resulting from the turn-on operation of the thyristor is much lower than a resistance of the diode upon the breakdown operation of the NPN transistor 4. Hence, a larger surge current can flow as a result of turning the thyristor on.

Further, the snap back operation of the transistor is described next. As for the transistor, if a potential difference between the emitter terminal and the collector terminal increases in such conditions that the base terminal is opened (high impedance), minority carriers are generated between the emitter terminal and the base terminal. As a result, a continuity between the collector terminal and emitter terminal of the transistor is ensured. That is, a potential difference between the emitter terminal and the collector terminal, which is barely able to generate minority carriers enough to drive the transistor between the emitter terminal and the base terminal is a snap back voltage. Further, a transistor operation in a region activated in accordance with the snap back voltage is a snap back operation.

An on-resistance of the transistor during the snap back operation is lower than a resistance of the diode during the breakdown operation. Thus, a larger surge current can flow through the transistor during the snap back operation than in the broken-down diode.

Here, operations of the electrostatic discharge protection device 1 are described in detail in accordance with conditions for applying electrostatic charges to the I/O terminal. First, description is made of the case of applying electrostatic charges under the GND+ condition. If the electrostatic charges are impressed under the GND+ condition, the breakdown of the diode occurs earlier than the breakdown at the PN junction of the NPN transistor 4, and the thyristor is turned on. A surge current flows from the I/O terminal into the GND terminal. In this embodiment, a breakdown voltage of the diode 5 is set lower than a breakdown voltage of a diode formed between the emitter terminal and the base terminal of the NPN transistor 4.

Figure 2:
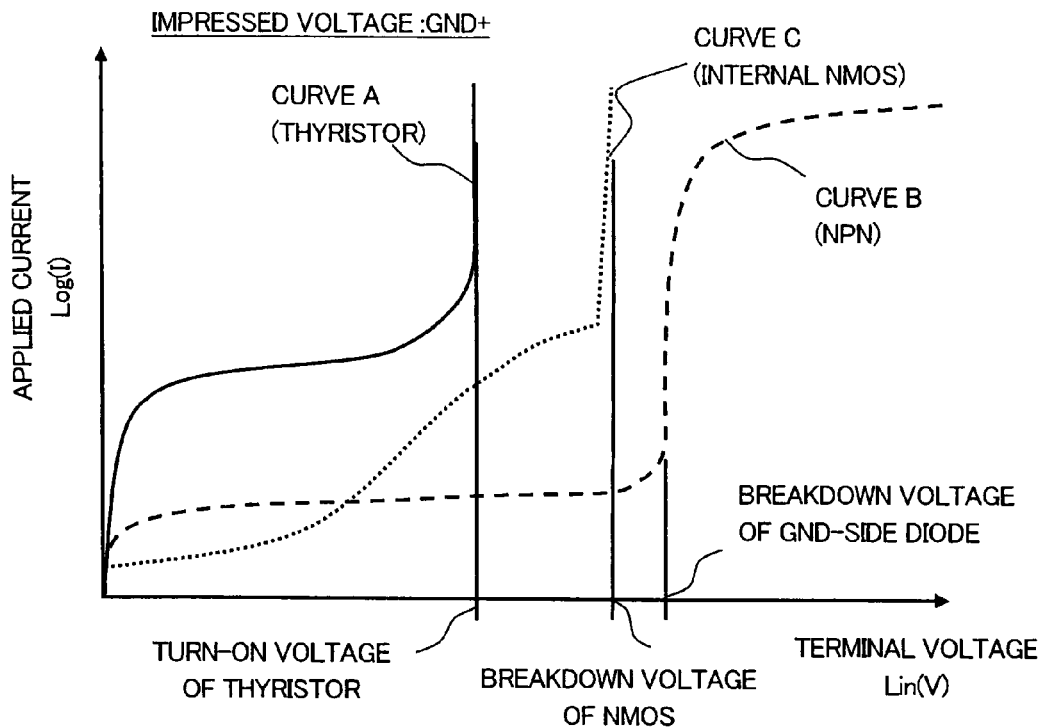
FIG. 2 is a graph showing current-voltage characteristics of an element upon applying electrostatic charges under GND+ conditions in the electrostatic discharge protection circuit of the first embodiment.

FIG. 2 shows current-voltage characteristics of the thyristor, the NPN transistor 4, and the NMOS transistor of the internal circuit under the GND+ condition. Incidentally, in the graph of FIG. 2, the vertical axis represents an absolute value of current applied to the I/O terminal, and the horizontal axis represents an absolute value of a terminal voltage of the I/O terminal. Further, a curve A represents current-voltage characteristics of the thyristor, a curve B represents current-voltage characteristics of the NPN transistor 4, and a curve C represents current-voltage characteristics of the NMOS transistor.

As shown in FIG. 2, a voltage at which the diode 5 is broken down, that is, a voltage at which thyristor is turned on is lower than a breakdown voltage of the NMOS transistor and a breakdown voltage of the diode of the NPN transistor 4. Due to the characteristics, a surge current generated when electrostatic charges are impressed to the I/O terminal is discharged by the thyristor to prevent a potential difference between the I/O terminal and the GND terminal from increasing. Further, a potential difference between the I/O terminal and the GND terminal is prevented from increasing, so a parasitic diode of the NPN transistor 4 is not broken down, and almost no current flows through the parasitic diode.

Figure 3:
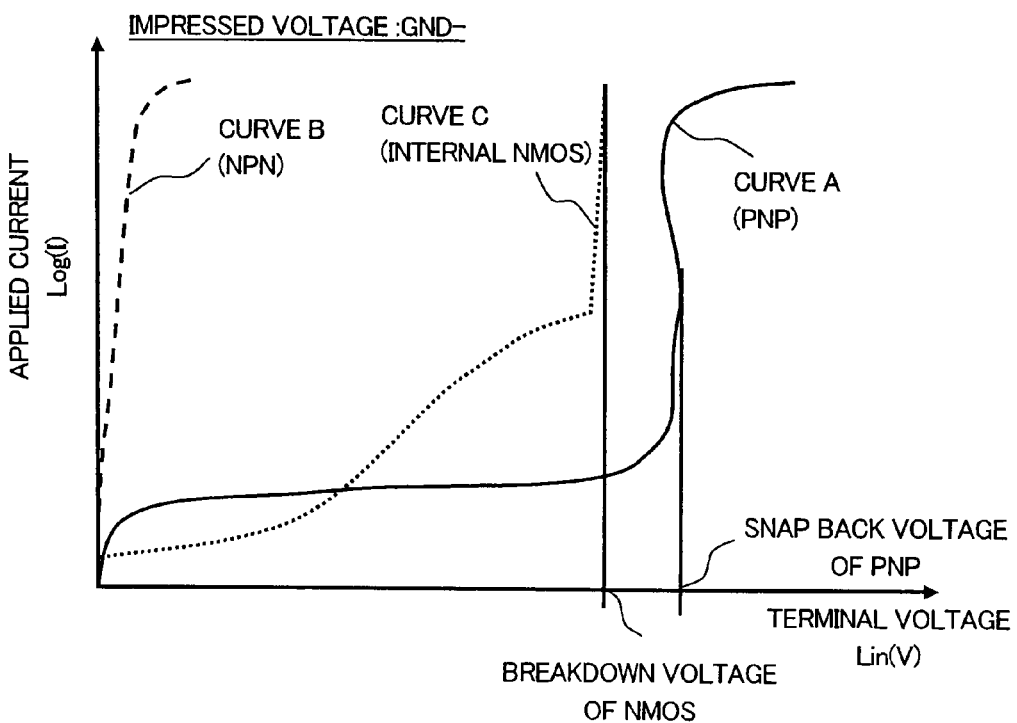
FIG. 3 is a graph showing current-voltage characteristics of an element upon applying electrostatic charges under GND− conditions in the electrostatic discharge protection circuit of the first embodiment.

Description is given of an example where electrostatic charges are impressed under the GND− condition. A surge current in this condition flows into the I/O terminal from the GND terminal through the NPN transistor 4 due to a forward-bias current in the parasitic diode of the NPN transistor 4. FIG. 3 shows current-voltage characteristics of the thyristor, the NPN transistor 4, and the NMOS transistor of the internal circuit under the GND− condition. Incidentally, in the graph of FIG. 3, the vertical axis represents an absolute value of current applied to the I/O terminal, and the horizontal axis represents an absolute value of a terminal voltage of the I/O terminal. Further, a curve A represents current-voltage characteristics of the PNP transistor 2, a curve B represents current-voltage characteristics of the NPN transistor 4, and a curve C represents current-voltage characteristics of the NMOS transistor.

As shown in FIG. 3, the current-voltage characteristics of the NPN transistor 4 show sharp gradient in accordance with the forward-bias of the diode. Due to the characteristics, a surge current generated when electrostatic charges are impressed to the I/O terminal is discharged due to the forward-bias of the diode of the NPN transistor 4 to prevent a potential difference between the I/O terminal and the GND terminal from increasing. Thus, almost no current flows through the thyristor under the GND− condition.

Figure 4:
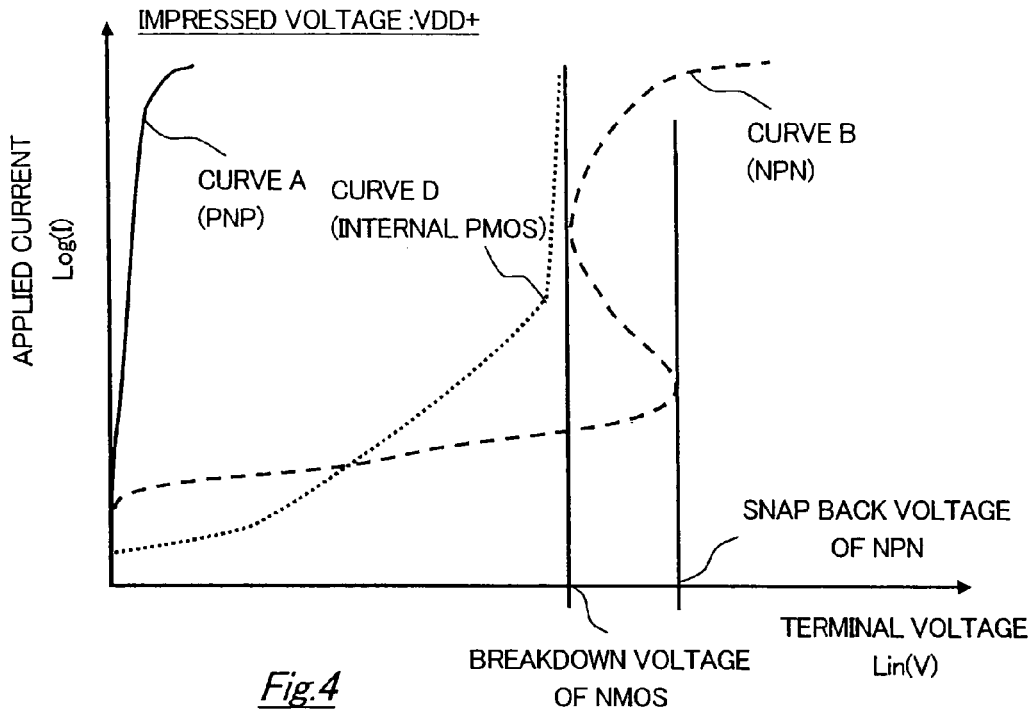
FIG. 4 is a graph showing current-voltage characteristics of an element upon applying electrostatic charges under VDD+ conditions in the electrostatic discharge protection circuit of the first embodiment.

Description is given of an example where electrostatic charges are impressed under the VDD+ conditions. A surge current in this condition flows from the I/O terminal into the VDD terminal through the PNP transistor 2 in accordance with the forward-bias of the diode of the PNP transistor 2 in the thyristor. FIG. 4 shows current-voltage characteristics of the NPN transistor 4, the PNP transistor 2, and the PMOS transistor of the internal circuit under the VDD+ conditions. Incidentally, in the graph of FIG. 4, the vertical axis represents an absolute value of current applied to the I/O terminal, and the horizontal axis represents an absolute value of a terminal voltage of the I/O terminal. Further, a curve A represents current-voltage characteristics of the PNP transistor 2, a curve B represents current-voltage characteristics of the NPN transistor 4, and a curve D represents current-voltage characteristics of the PMOS transistor.

As shown in FIG. 4, the current-voltage characteristics of the PNP transistor 2 show sharp gradient in accordance with the forward-bias of the diode. Further, the snap back voltage of the NPN transistor 4 is higher than a breakdown voltage of the NMOS transistor. Due to the characteristics, a surge current generated when electrostatic charges are impressed to the I/O terminal is discharged in accordance with the forward-bias of the PNP transistor 2 to prevent a potential difference between the I/O terminal and the VDD terminal from increasing. Further, a potential difference between the I/O terminal and the VDD terminal is prevented from increasing, so almost no current flows through the NPN transistor 4.

Figure 5:
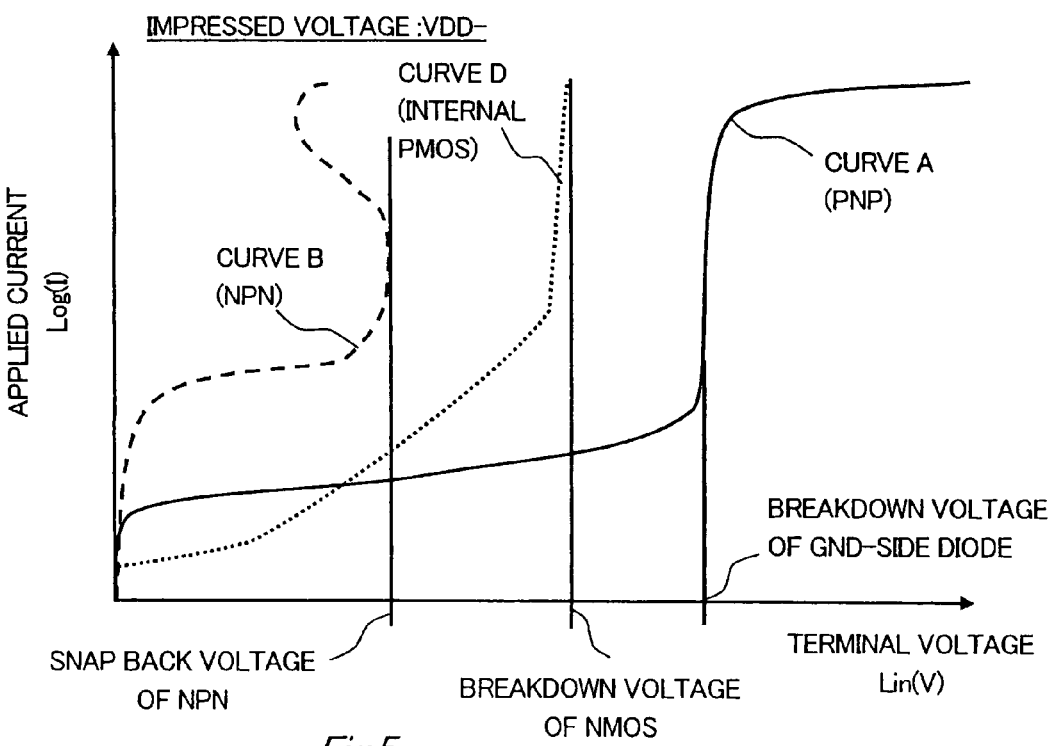
FIG. 5 is a graph showing current-voltage characteristics of an element upon applying electrostatic charges under VDD− conditions in the electrostatic discharge protection circuit of the first embodiment.

Description is given of an example where electrostatic charges are impressed under the VDD− conditions. A surge current in this condition flows from the VDD terminal into the I/O terminal through the NPN transistor 4 since the NPN transistor 4 is turned on. In this embodiment, a snap back voltage of the NPN transistor 4 is set lower than a breakdown voltage of the parasitic diode of the PNP transistor 2. FIG. 5 shows current-voltage characteristics of the thyristor, the NPN transistor 4, and the NMOS transistor of the internal circuit under the VDD− conditions. Incidentally, in the graph of FIG. 5, the vertical axis represents an absolute value of current impressed to the I/O terminal, and the horizontal axis represents an absolute value of a terminal voltage of the I/O terminal. Further, a curve A represents current-voltage characteristics of the PNP transistor 2, a curve B represents current-voltage characteristics of the NPN transistor 4, and a curve D represents current-voltage characteristics of the PMOS transistor.

As shown in FIG. 5, a snap back voltage of the NPN transistor 4 is lower than a breakdown voltage of the NMOS transistor and a breakdown voltage of the parasitic diode of the PNP transistor 2. Due to the characteristics, a surge current generated when electrostatic charges are impressed to the I/O terminal under the VDD− conditions is discharged through the snap back operation of the NPN transistor 4 to prevent a potential difference between the I/O terminal and the VDD terminal from increasing. Further, a potential difference between the I/O terminal and the VDD terminal is prevented from increasing, so the parasitic diode of the PNP transistor 2 is broken down, and almost no current flows into the parasitic diode.

As understood from the above description, in the electrostatic discharge protection device 1 of this embodiment, a turn-on voltage of the thyristor is set lower than a breakdown voltage of the parasitic diode formed between the emitter terminal and the base terminal of the NPN transistor 4. Further, a snap back voltage of the NPN transistor 4 is set lower than a breakdown voltage of the parasitic diode of the PNP transistor 2. Hence, the electrostatic discharge protection device 1 of this embodiment can discharge a surge current without involving breakdown of the PNP transistor 2, and the parasitic diode of the NPN transistor 4.

An on-resistance of the on-state thyristor and an on-resistance of the transistor under the snap back operation are lower than an on-resistance of the broken-down parasitic diode. Thus, the electrostatic discharge protection device is configured as shown in FIG. 1 to thereby allow a larger amount of surge current to flow therethrough.

Figure 6:
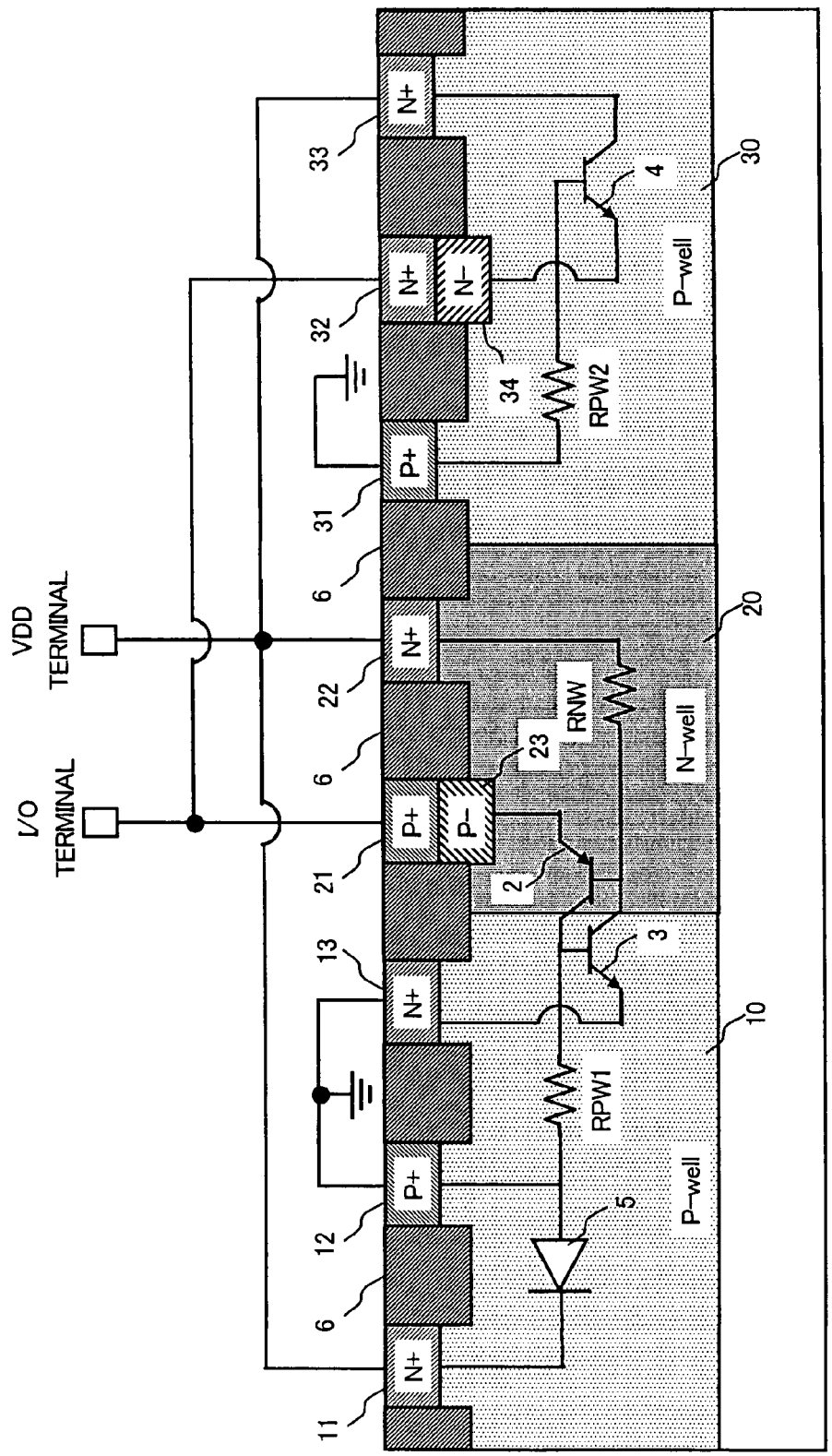
FIG. 6 is a sectional view of the electrostatic discharge protection circuit of the first embodiment.

Description is now given of the structure of the transistor of this embodiment. FIG. 6 shows the electrostatic discharge protection device 1 of this embodiment in section.

As shown in FIG. 6, a P-well region 10 for forming the NPN transistor 3, an N-well region 20 for forming the PNP transistor 2, and a P-well region 30 for forming the NPN transistor 4 are formed on a substrate region.

A base region 31, an emitter region 32, and a collector region 33 of the NPN transistor 4 shown in FIG. 1 are selectively formed in the P-well region 30. The base region 31 is made of a P-type semiconductor with an impurity concentration higher than that of the P-well region 30. The emitter region 32 is formed of an N-type semiconductor with an impurity concentration higher than that of the N-well region 30. Further, a region positioned below and adjacent to the emitter region 32 is formed of an N-type semiconductor, and an LDDP region 34 with an impurity concentration lower than that of the emitter region 32 is formed in this region. The collector region 33 is made of an N-type semiconductor with an impurity concentration higher than that of the N-well region 30.

An emitter region 21 and a base region 22 of the PNP transistor 2 shown in FIG. 1 are formed in the N-well region 20. The base region 22 is formed of an N-type semiconductor, with an impurity concentration higher than that of the N-well region 20. The emitter region 21 is formed of a P-type semiconductor with an impurity concentration higher than that of the P-well region. Further, an LDDB region 23 that is made of a P-type semiconductor with an impurity concentration lower than that of the emitter region 21 is formed in a region below and adjacent to the emitter region 21. Incidentally, the P-well region 10 where the NPN transistor 3 is formed serves as a collector of the PNP transistor 2.

An emitter region 13 of the NPN transistor 3 and an anode region 12 and a cathode region 11 of the diode 5 as shown in FIG. 1 are formed on the P-well region 10. The emitter region 13 is formed of an N-type semiconductor with an impurity concentration higher than that of the N-well region. Incidentally, the P-well region 10 where the NPN transistor 3 is formed servers as a base of the NPN transistor 3, and the N-well region 20 where the PNP transistor is formed servers as a collector of the NPN transistor 3.

The anode region of the diode 5 is formed of a P-type semiconductor with an impurity concentration higher than that of the P-well region 10. The cathode region of the diode 5 is made of an N-type semiconductor with an impurity concentration higher than that of the N-well region 20.

Incidentally, an insulative region 6 is formed in a portion above the N-well regions 10 and 30 except the base region, the collector region, the emitter region, the anode region, and the cathode region.

As understood from the above description, in the electrostatic discharge protection device 1 of this embodiment, regions with an impurity concentration lower than that of the emitter region (LDDB region 23 and LDDP region 34) are formed below the emitter regions 21 and 32, making it possible to control an intensity of electric field generated between emitter region and the well region based on a voltage applied to the emitter terminal. As a result, a breakdown voltage of a diode formed between the emitter terminal and the base terminal is set higher than a breakdown voltage of the diode 5 or a snap back voltage of the NPN transistor. A breakdown voltage of the parasitic diode of the transistor can be adjusted by changing an impurity concentration of the LDDB region 23 and the LDDP region 34.

Figure 7:
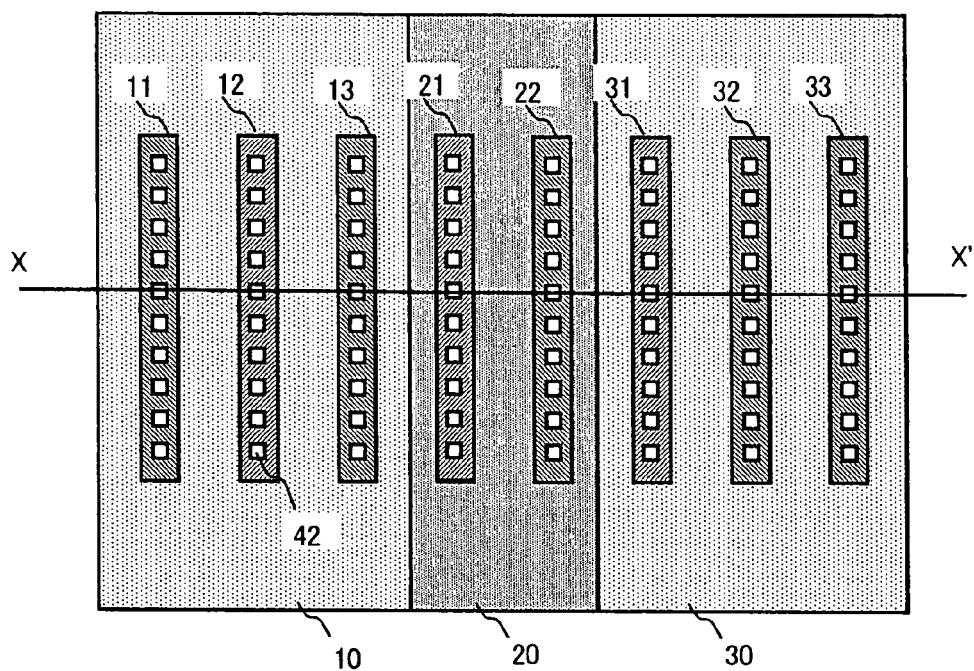
FIG. 7 shows a layout of the electrostatic discharge protection circuit of the first embodiment.
Figure 8:
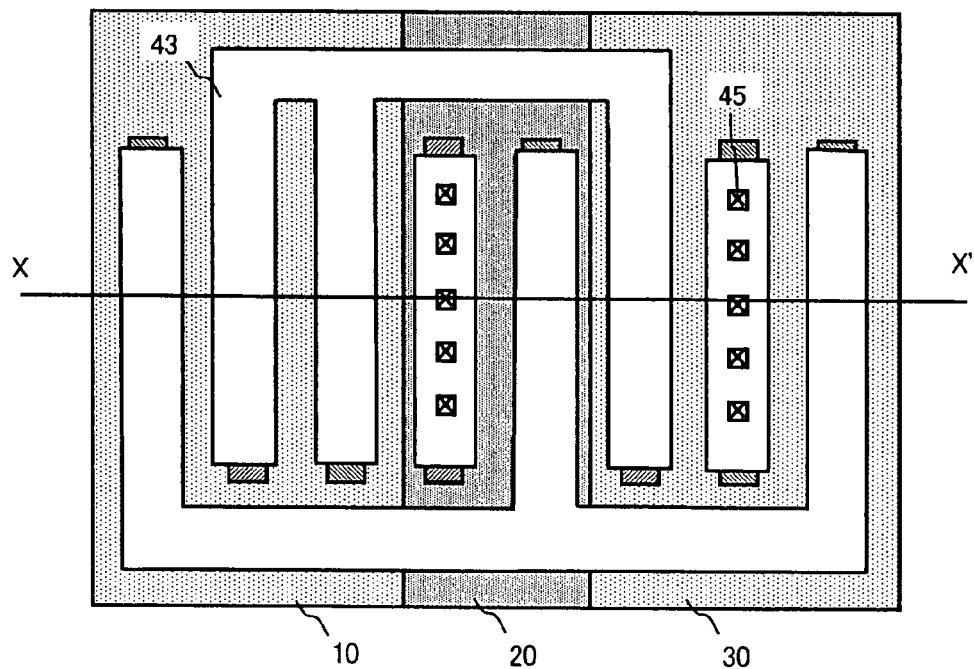
FIG. 8 shows a layout of the electrostatic discharge protection circuit of FIG. 7, on which a metal line is formed.
Figure 9:
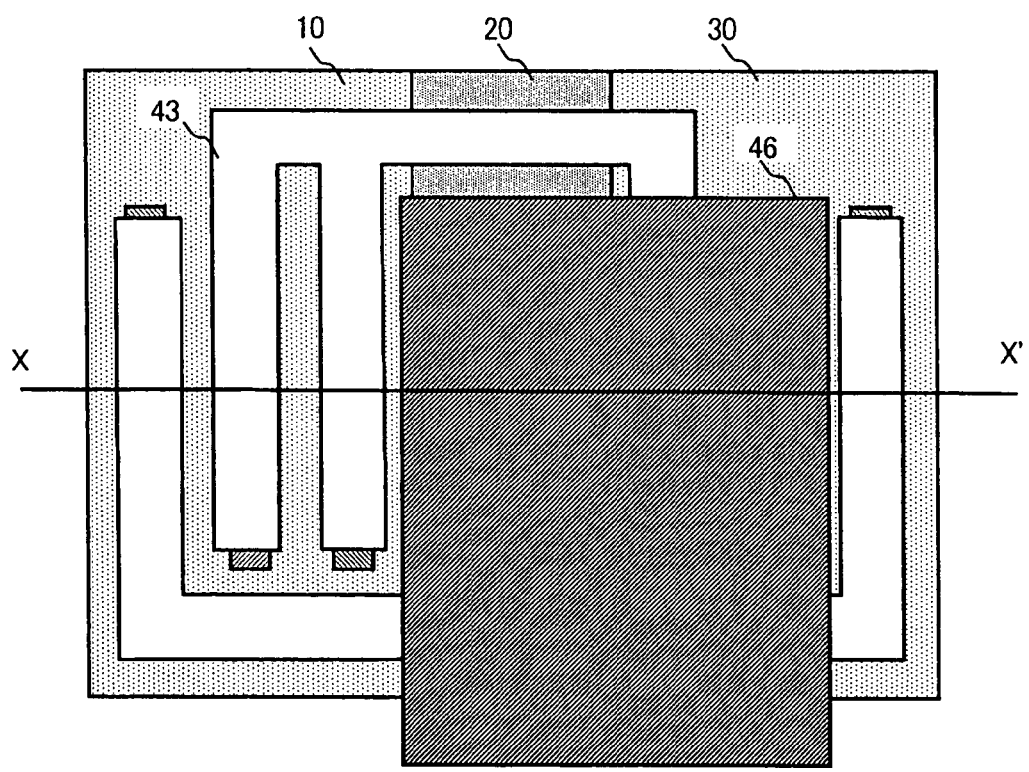
FIG. 9 shows a layout of the electrostatic discharge protection circuit of FIG. 8, on which a metal line is formed.

Referring to FIGS. 7 to 9 and FIGS. 10 to 15, a manufacturing method of the electrostatic discharge protection device 1 is described next. FIGS. 7 to 9 are top views of the electrostatic discharge protection device of this embodiment, FIGS. 10 to 15 are sectional views taken along the line X-X' of FIGS. 7 to 9.

Figure 10:
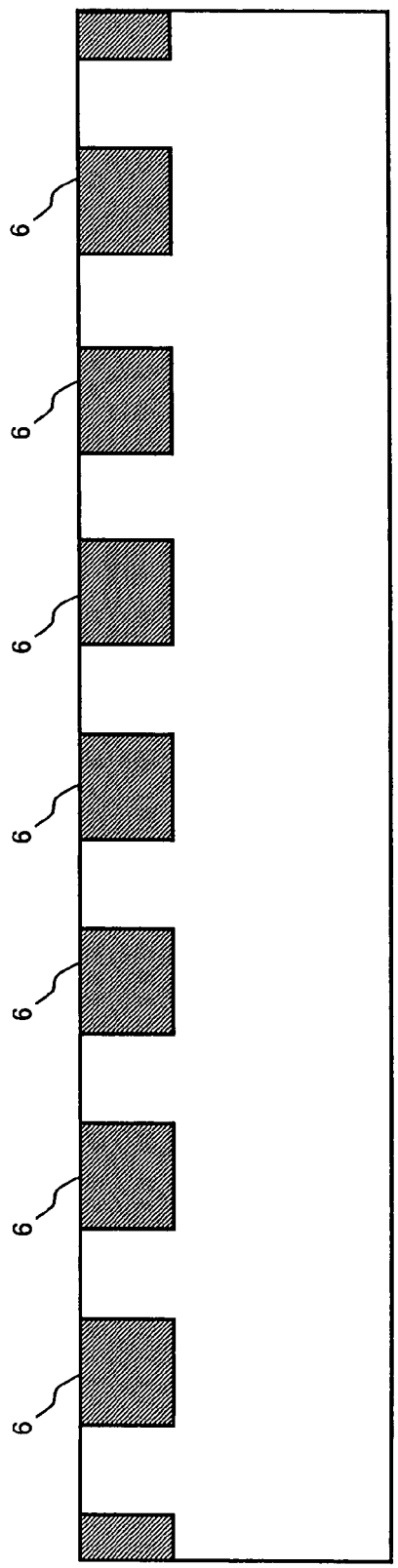
FIG. 10 is a sectional view of the electrostatic discharge protection circuit of the first embodiment, which has been completed up to a first step.

FIG. 10 is a sectional view of the electrostatic discharge protection device 1 that has been completed up to a first step. In the first step, a trench is selectively formed in a P-type semiconductor layer on the substrate region, and an insulator such as an oxide film is filled into the trench to thereby form the insulative region 6.

Figure 11:
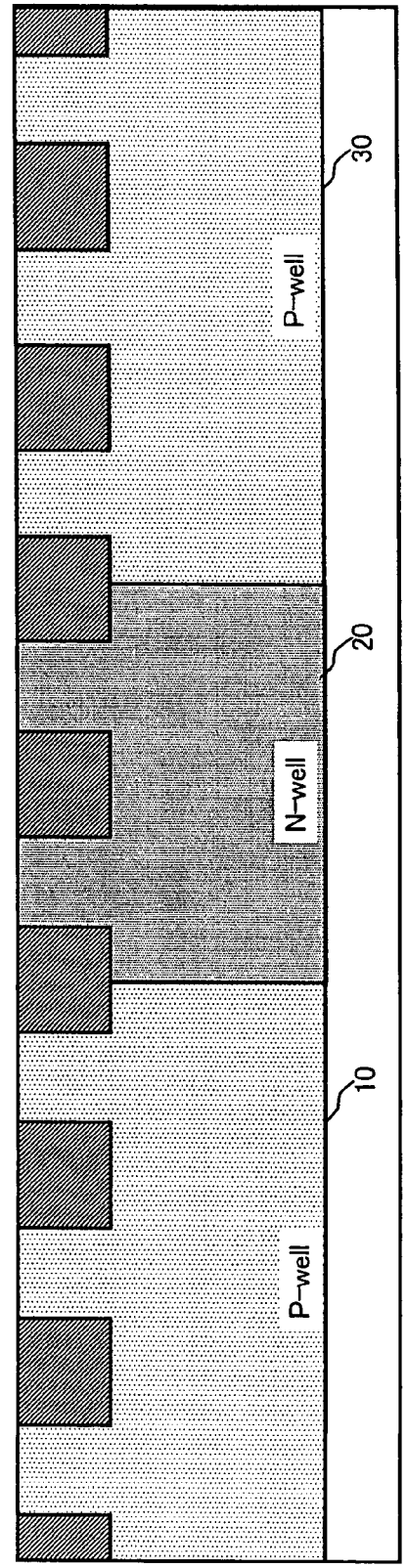
FIG. 11 is a sectional view of the electrostatic discharge protection circuit of the first embodiment, which has been completed up to a second step.

FIG. 11 is a sectional view of the electrostatic discharge protection device 1 that has been completed up to a second step. As shown in FIG. 11, in the second step, the P-well regions 10 and 30 and the N-well region 20 are formed. The shapes of the P-well regions 10 and 30 and the N-well region 20 are determined through patterning; the patterning step selectively applies a resist with a mask. Based on the patterning, impurities are injected into a predetermined region to thereby form the P-well regions 10 and 30 and the N-well region 20. In the case of forming the P-well region, for example, boron ions are implanted. In the case of forming the N-well region, for example, phosphorous ions are implanted.

Figure 12:
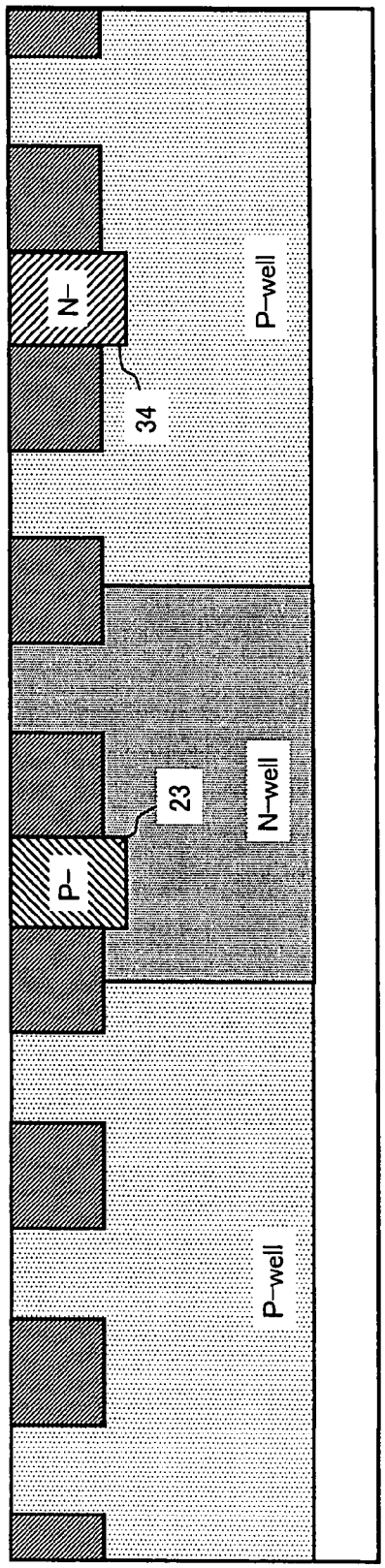
FIG. 12 is a sectional view of the electrostatic discharge protection circuit of the first embodiment, which has been completed up to a third step.

FIG. 12 is a sectional view of the electrostatic discharge protection device 1 that has been completed up to a third step. As shown in FIG. 12, in the third step, low-concentration regions for increasing a breakdown voltage of the diode (LDDB region 23 and LDDP region 34) are formed. In the LDDB region 23, the emitter region 21 of the PNP transistor 2 is formed. The LDDB region 23 is formed in a deeper portion than the emitter region 21. The LDDB region 23 is obtained by implanting, for example, boron ions. In the LDDP region 34, the emitter region 31 of the PNP transistor 4 is formed. The LDDP region 34 is formed in a deeper portion than the emitter region 31. The LDDP region 34 is obtained by implanting, for example, phosphorous ions. Here, the impurity concentration of the LDDB region 23 and the LDDP region 34 is substantially equal to that of the N-well region and the P-well region.

Figure 13:
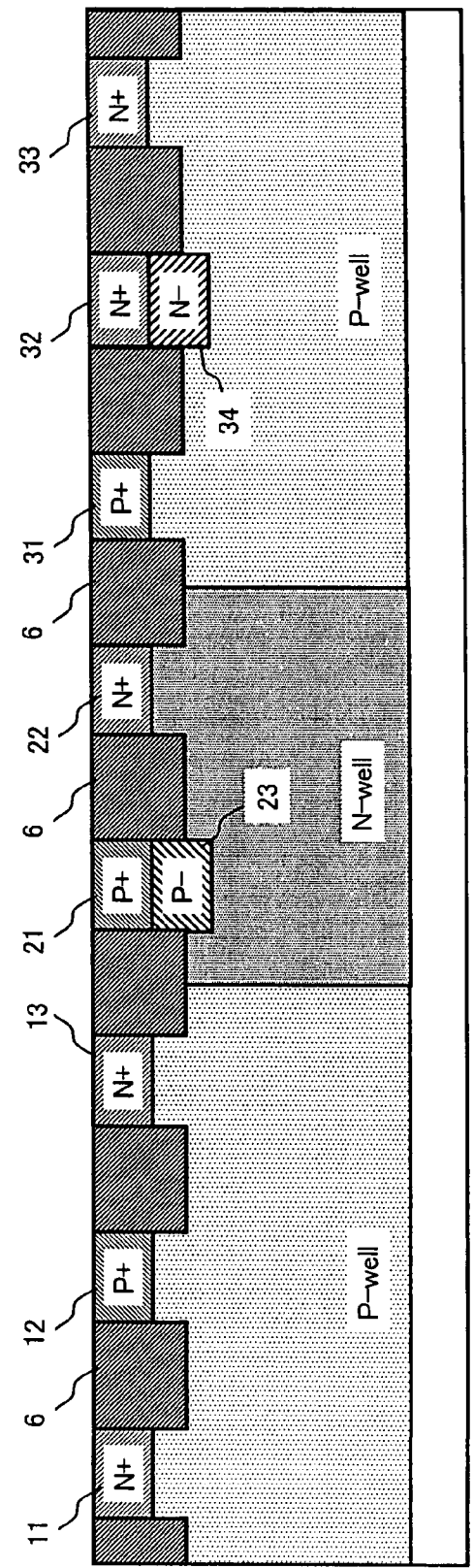
FIG. 13 is a sectional view of the electrostatic discharge protection circuit of the first embodiment, which has been completed up to a fourth step.

FIG. 13 is a sectional view of the electrostatic discharge protection device 1 that has been completed up to a fourth step. As shown in FIG. 13, in the fourth step, the base region, the collector region, the emitter region, the anode region, and the cathode region are formed. The base region 31 of the NPN transistor 4, the emitter region 21 of the PNP transistor 2, and the anode region 12 of the diode 5 are obtained by implanting boron ions. A concentration of doped impurities is higher than an impurity concentration of the P-well region. On the other hand, the collector region 33 and emitter region 32 of the NPN transistor 4, the emitter region 13 of the NPN transistor 3, and the base region 22 of the PNP transistor 2 are obtained by implanting arsenic ions. A concentration of doped impurities is higher than an impurity concentration of the N-well region. The top view of FIG. 7 shows the device completed up to this step and a contact formed in the next step.

Figure 14:
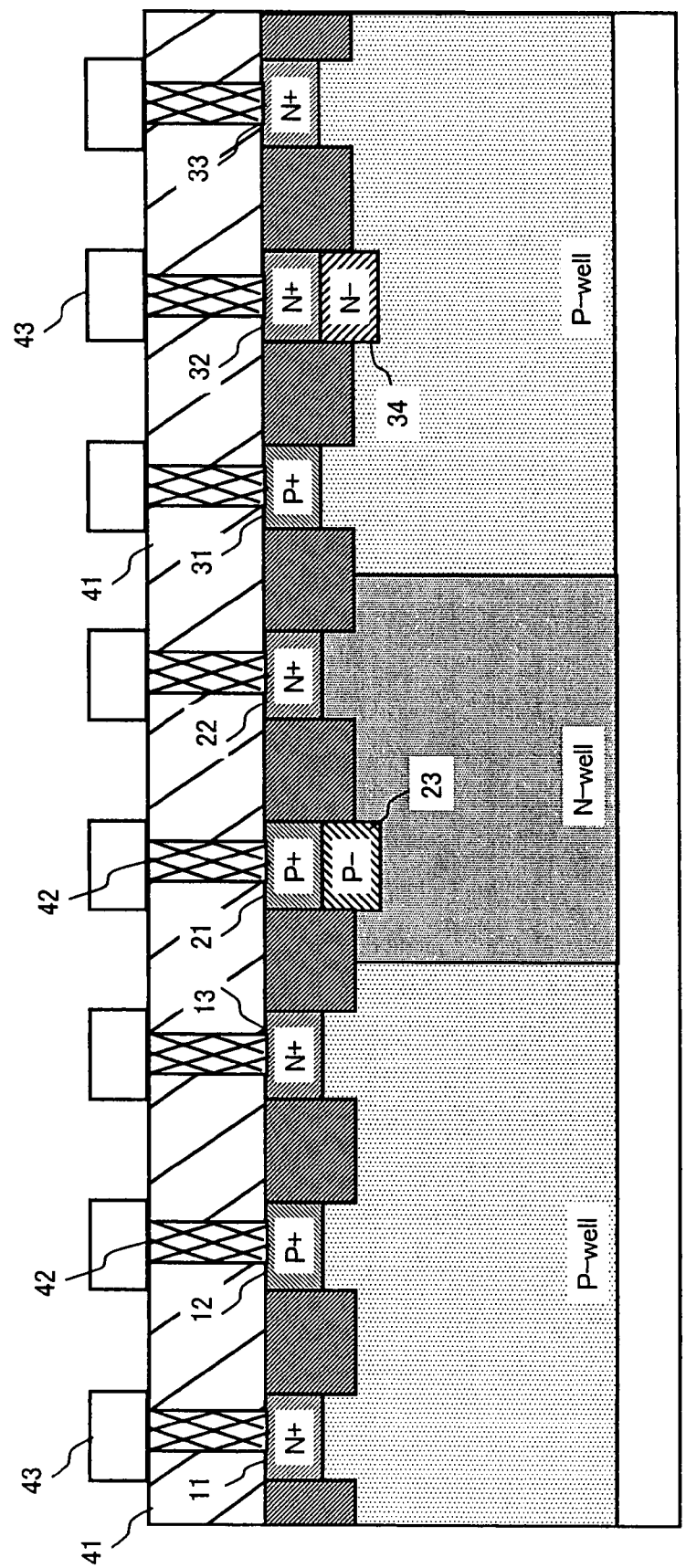
FIG. 14 is a sectional view of the electrostatic discharge protection circuit of the first embodiment, which has been completed up to a fifth step.

FIG. 14 is a sectional view of the electrostatic discharge protection device 1 that has been completed up to a fifth step. As shown in FIG. 14, in the fifth step, an interlayer film 41, a contact 42, and a first metal line 43 are formed. The interlayer film 41 is formed to cover the element region surface. The contact 42 is passed through the interlayer film 41 to expose the base region, the collector region, and the emitter region. The contact 42 is obtained by filling a metal material into a trench formed in the interlayer film 41. The first metal line 43 is laid down in accordance with a connection form of elements in the electrostatic discharge protection device 1, and is formed on the surface of the interlayer film 41. The device that has been completed up to the formation of the metal line is shown in the top view of FIG. 8. Incidentally, FIG. 8 shows a via-hole formed in the next step together with the device.

Figure 15:
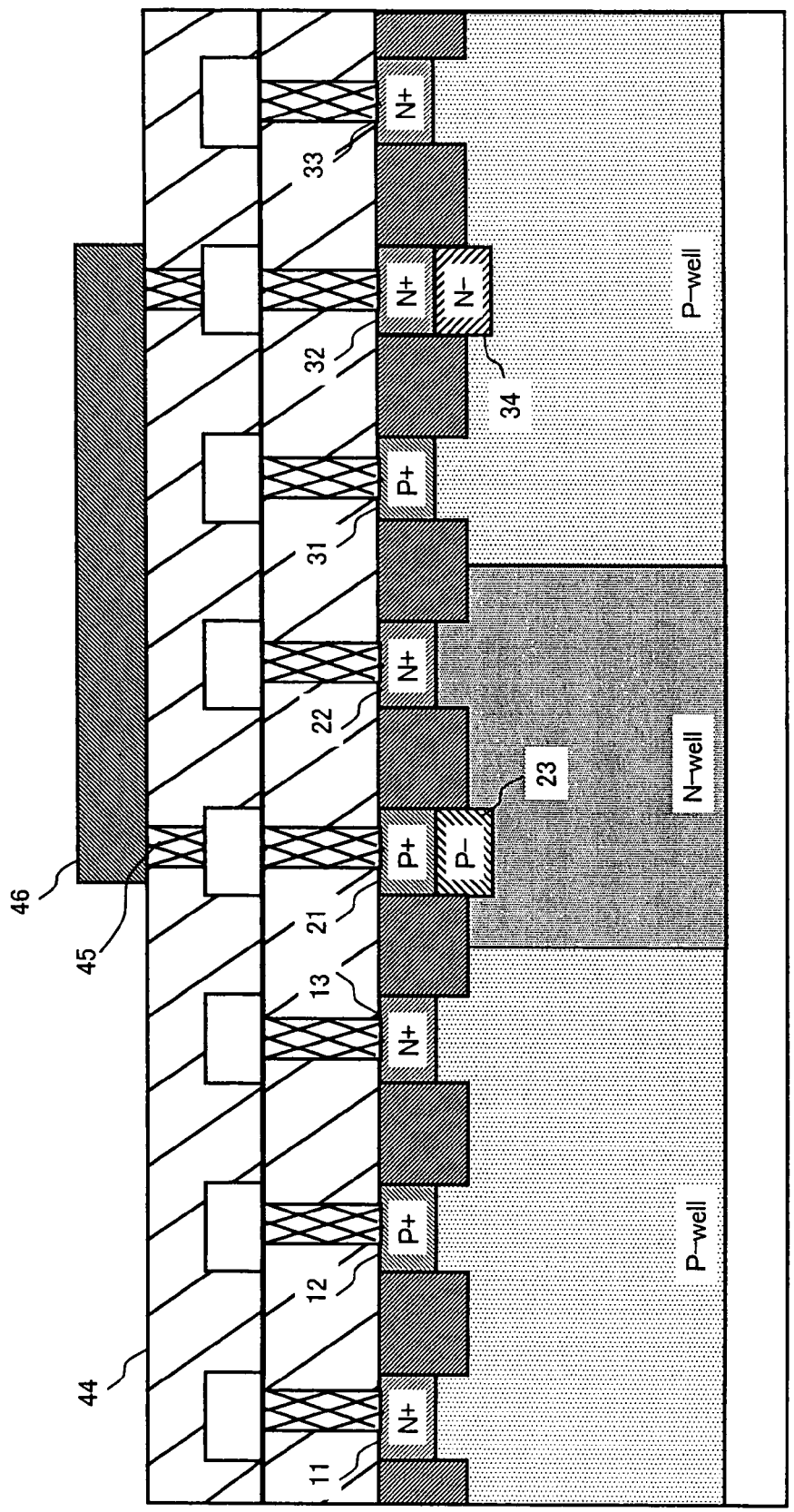
FIG. 15 is a sectional view of the electrostatic discharge protection circuit of the first embodiment, which has been completed up to a sixth step.

FIG. 15 is a sectional view of the electrostatic discharge protection device 1 that has been completed up to a sixth step. As shown in FIG. 15, in the sixth step, an interlayer film 44, a via-hole 45, and a second metal line 46 are formed. The interlayer film 44 is formed to insulate the first metal line from the second metal line. The via-hole 45 connects between the first metal line and the second metal line. The via-hole 45 is obtained by filling a metal material into a hole passed through the interlayer film 44 to expose the first metal line surface. The second metal line 46 is formed on the interlayer film 8. The finished device is shown in the top view of FIG. 9.

Through the first to sixth steps, the electrostatic discharge protection device 1 of this embodiment can be manufactured. Further, the above steps may be steps in a manufacturing process of a MOS transistor. In this case, an internal circuit can be protected against breakdown by the electrostatic discharge protection device 1 of this embodiment even in a circuit composed of MOS transistors the breakdown voltage of which is low. Incidentally, the manufacturing process including above steps is an example of a manufacturing method, and the manufacturing method of the electrostatic discharge protection device 1 of this embodiment is not limited thereto.

Modified Examples

Figure 16:
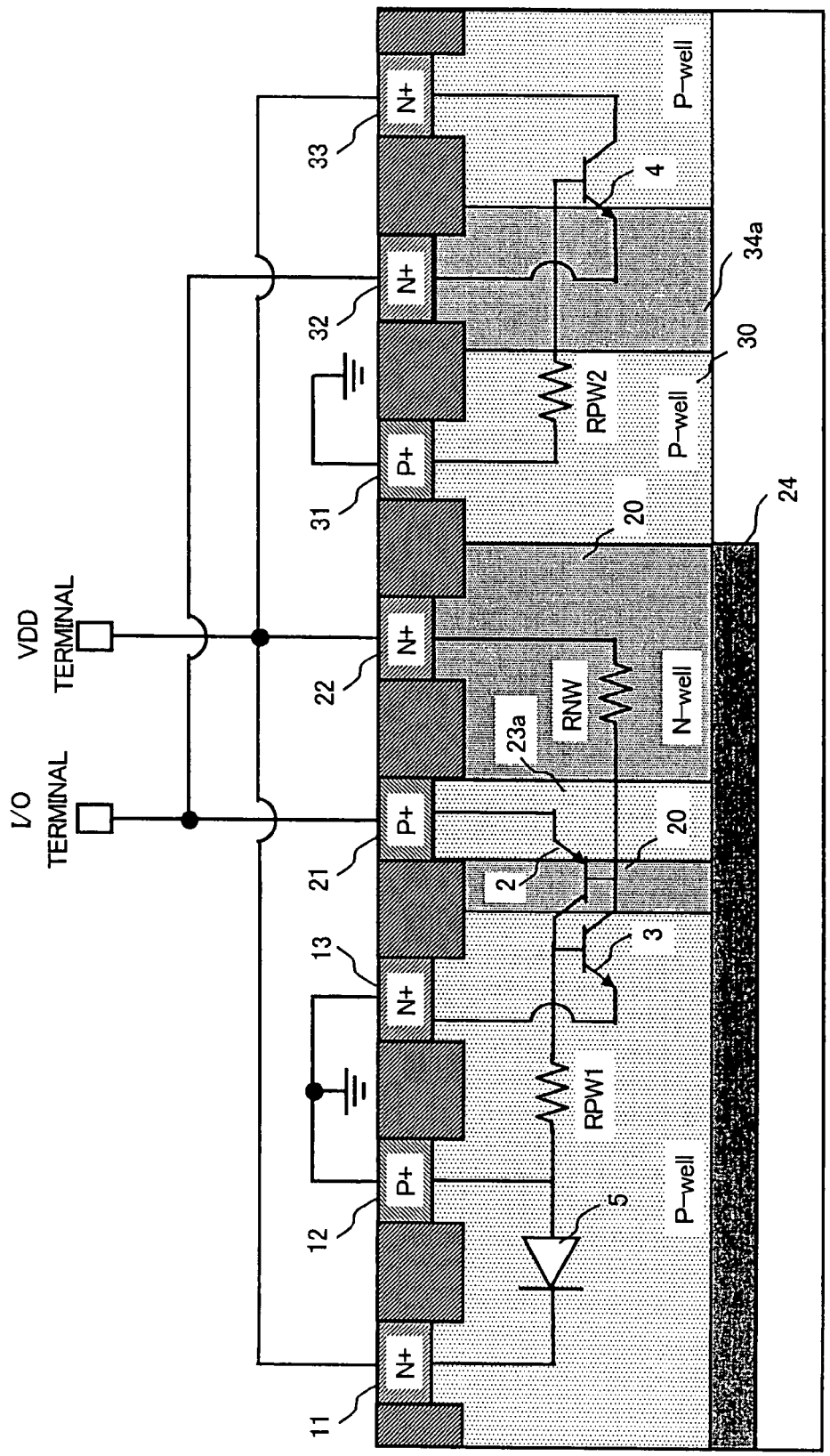
FIG. 16 is a sectional view of an electrostatic discharge protection circuit according to a modified example of the first embodiment.

Hereinafter, a modified example of the electrostatic discharge protection device 1 of this embodiment device 1 is described next. Its structure is different from that of FIG. 6. First, a first modified example is explained. FIG. 16 is a sectional view of the electrostatic discharge protection device 1 of the first modified example. As shown in FIG. 16, the electrostatic discharge protection device of the first modified example includes a P-well region 23a and an N-well region 34a in place of the LDDB region 23 and the LDDP region 34. In this case as well, a region with an impurity concentration lower than that of the emitter region is formed between the emitter region and the base region. Thus, a breakdown voltage of a diode formed between the base terminal and the emitter terminal can be increased. Incidentally, in the first modified example, a deep N-well region 24 is formed below the region where the PNP transistor 3 is formed, for the purpose of insulating the P-well region 23a below the emitter region 21 from the substrate region 5. As shown in FIG. 16, the deep N-well region 24 is not formed below the N-well region 34a formed in place of the LDDP region 34, so the I/O terminal and the VDD terminal are not short-circuited.

Figure 17:
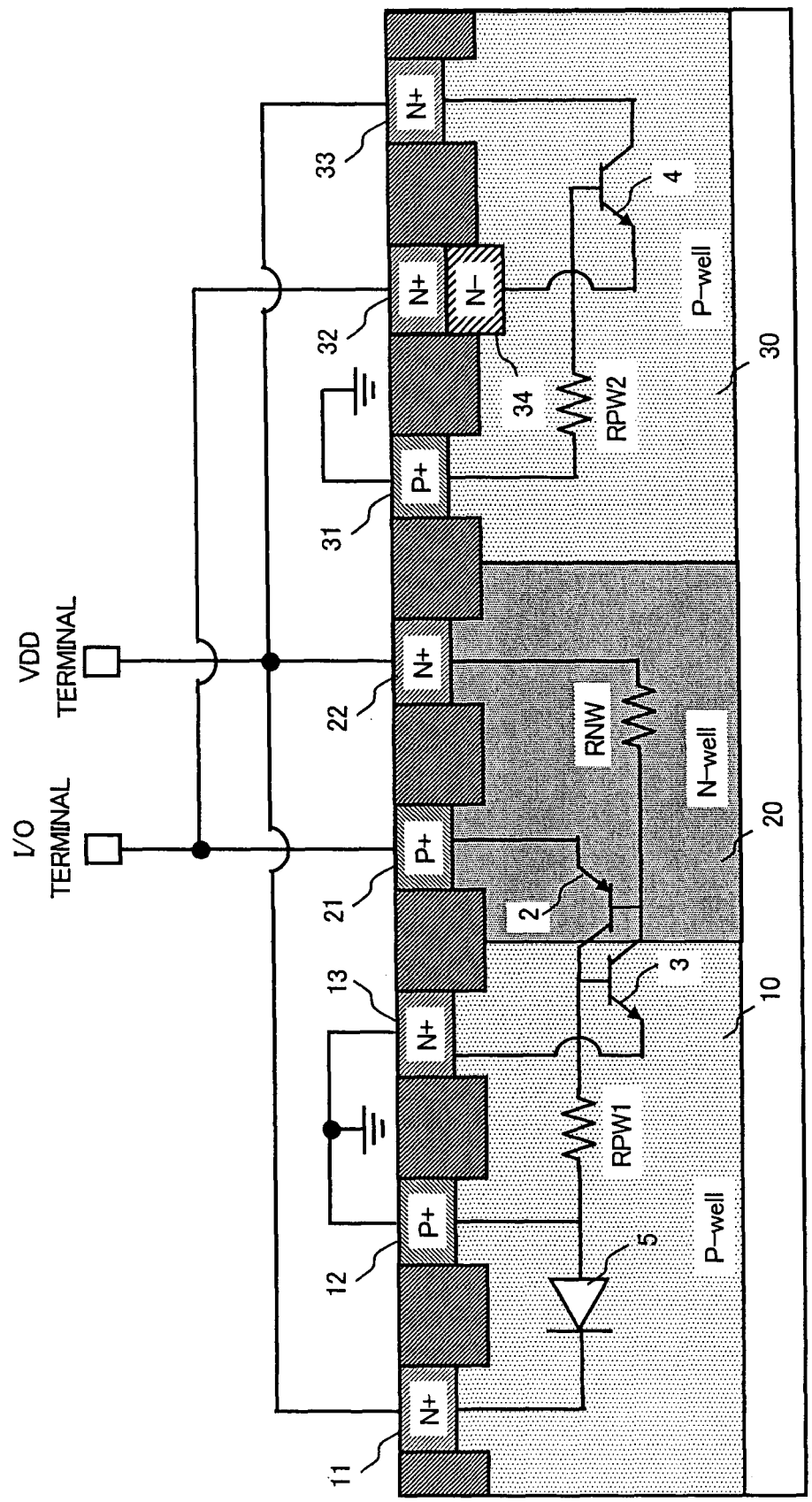
FIG. 17 is a sectional view of an electrostatic discharge protection circuit according to the modified example of the first embodiment.
Figure 18:
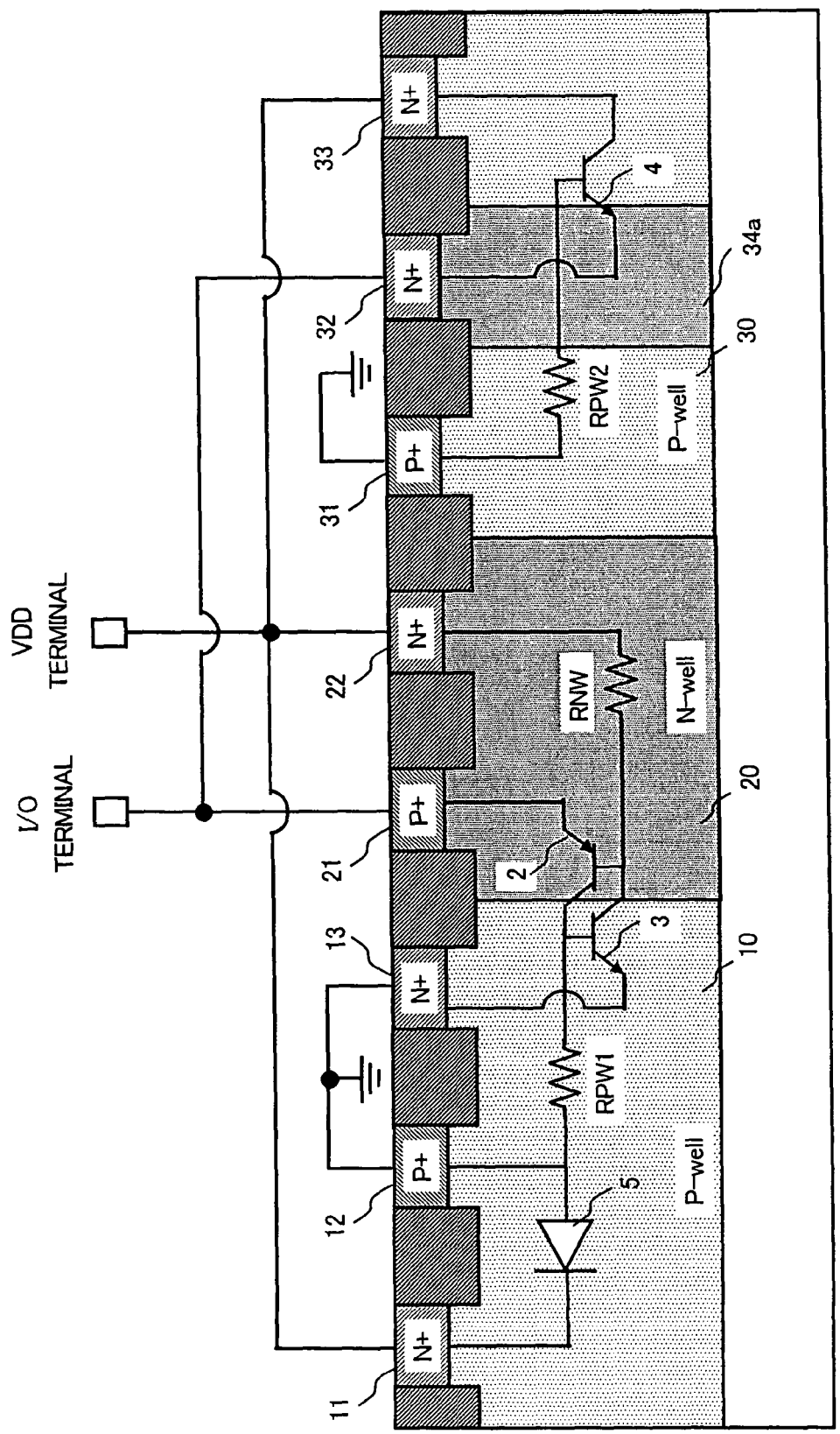
FIG. 18 is a sectional view of another example of the electrostatic discharge protection device according to the modified example of the first embodiment.

A second modified example is described next. The electrostatic discharge protection device 1 of the second modified example is intended for use under such conditions that a breakdown voltage between the emitter region 21 of the PNP transistor 2 and the N-well region 20 is high. FIG. 17 is a sectional view of the electrostatic discharge protection device 1 in this case. As shown in FIG. 17, the electrostatic discharge protection device 1 of the second modified example only includes the LDDP region 34 as a low-concentration region adjacent to the emitter region of the NPN transistor 4. In the second modified example as well, the LDDP region may be replaced by the P-well region 34a. FIG. 18 is a sectional view of the electrostatic discharge protection device 1 including the P-well region 34a in place of the LDDP region 34.

Figure 19:
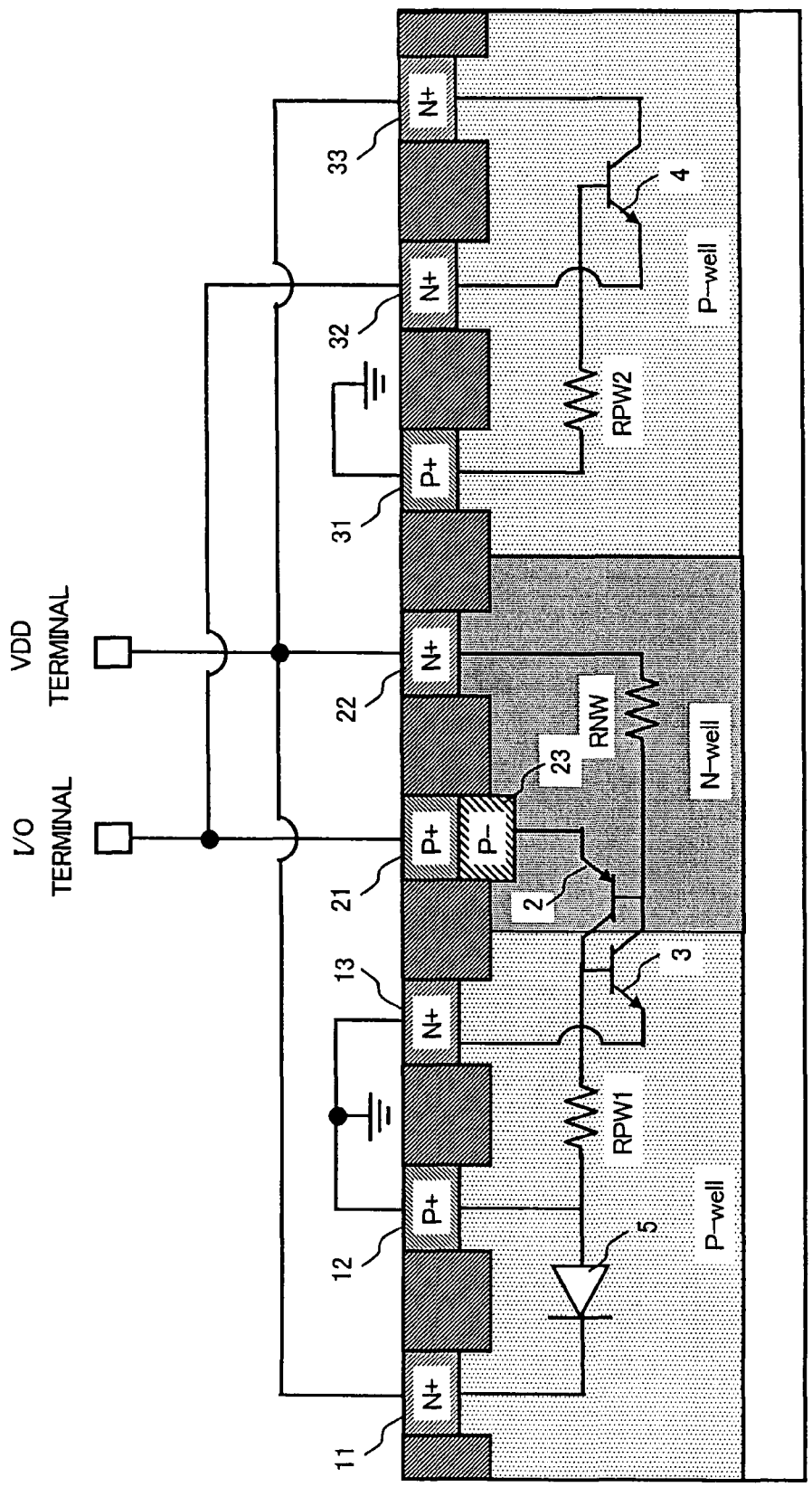
FIG. 19 is a sectional view of the electrostatic discharge protection device according to the modified example of the first embodiment.
Figure 20:
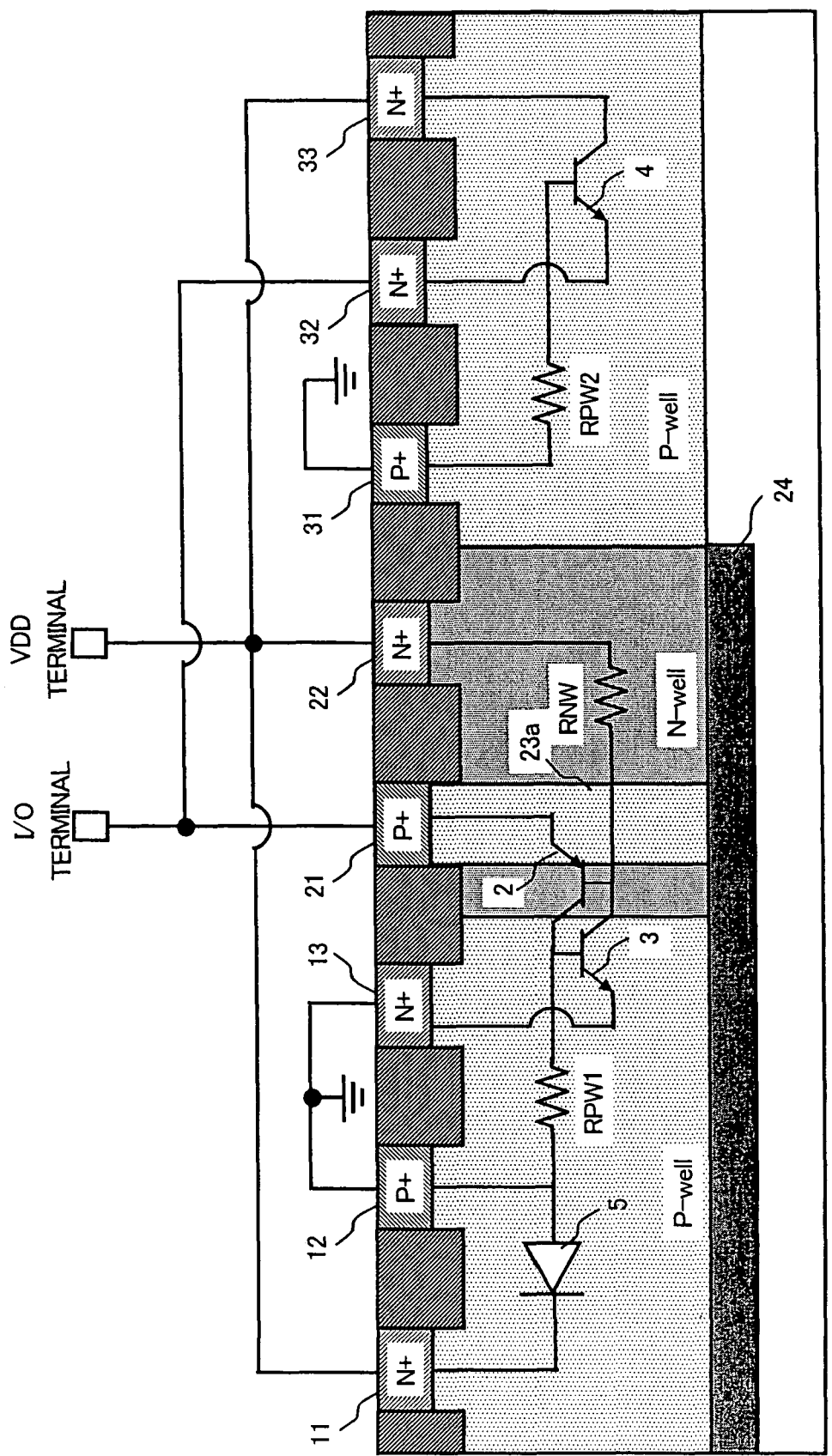
FIG. 20 is a sectional view of another example of the electrostatic discharge protection device according to the modified example of the first embodiment.

A third modified example is described. The electrostatic discharge protection device 1 of the third modified example is intended for use under such conditions that a breakdown voltage between the emitter region 32 of the NPN transistor 4 and the P-well region 30 is high. FIG. 19 is a sectional view of the electrostatic discharge protection device 1 in this case. As shown in FIG. 19, the electrostatic discharge protection device 1 of the third modified example only includes the LDDB region 23 as a low-concentration region adjacent to the emitter region 21 of the PNP transistor 2. In the third modified example as well, the LDDB region 23 may be replaced by the P-well region 23a. FIG. 20 is a sectional view of the electrostatic discharge protection device 1 including the P-well region 23a in place of the LDDB region 23. Incidentally, as shown in FIG. 20, the deep N-well region 24 may be formed below a region where the NPN transistor 2 is formed as well as the region where the PNP transistor 3 is formed.

Second Embodiment

A electrostatic discharge protection device 1a according to a second embodiment of the present invention differs from the electrostatic discharge protection device 1 of the first embodiment in that a resistance value of the parasitic resistance (resistor RNW and resistor RPW) formed in the well region is substantially increased. If a resistance value of the parasitic resistance is increased, after the breakdown of a diode between the emitter terminal and the base terminal, a potential difference between the I/O terminal and the VDD terminal or GND terminal can be increased in accordance with an amount of surge current. By increasing the potential difference, even if a breakdown operation of the parasitic diode of the transistor precedes the turn-on operation of the thyristor and the snap back operation of the transistor, the transistor starts the snap back operation before the diode is broken down.

For example, if a breakdown voltage of the diode largely fluctuates due to variations in manufacturing step, it is effective to substantially increase resistance values of the resistor RNW and the resistor RPW.

Figure 21:
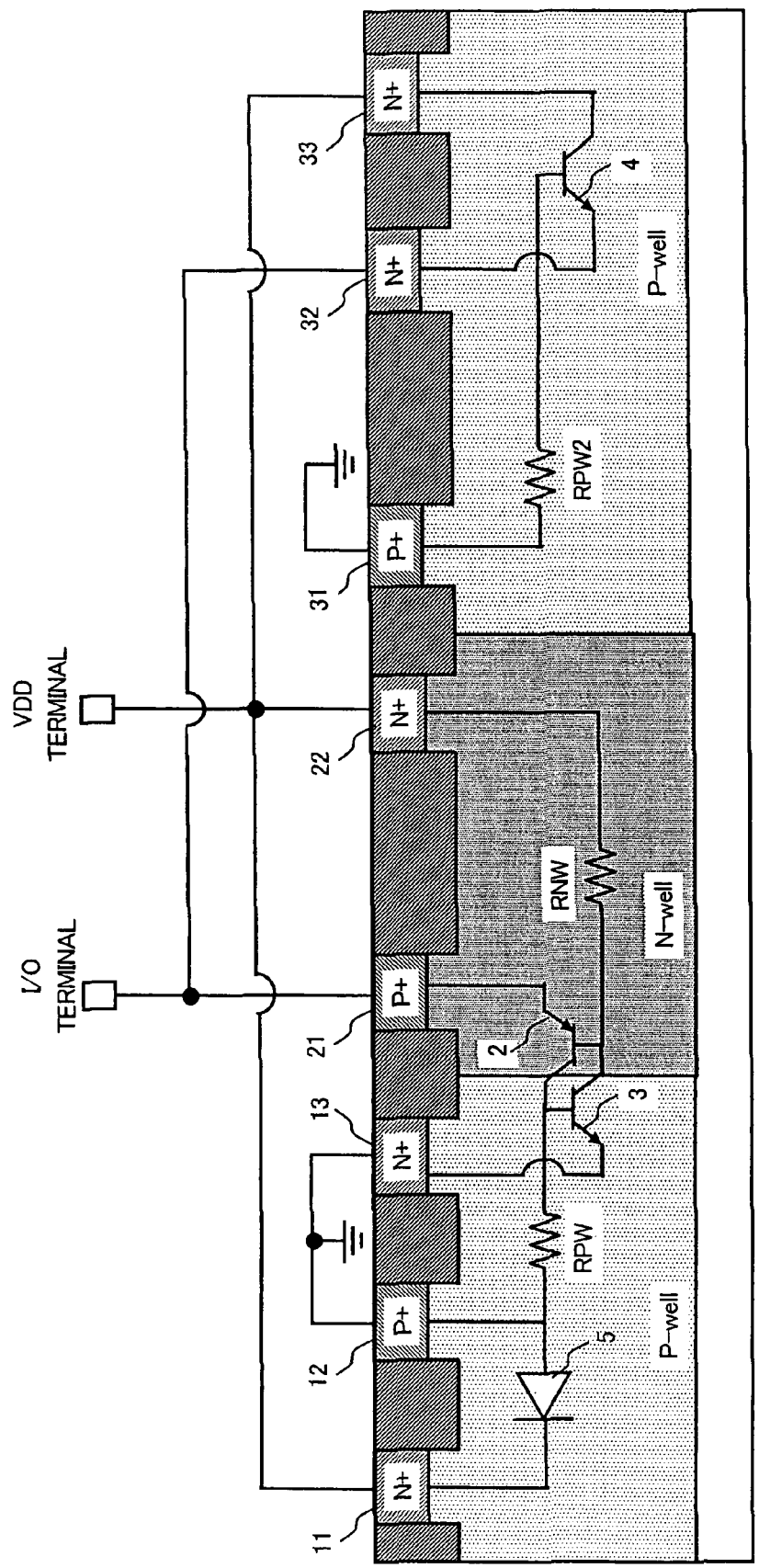
FIG. 21 is a sectional view of an electrostatic discharge protection circuit according to a second embodiment of the present invention.
Figure 22:
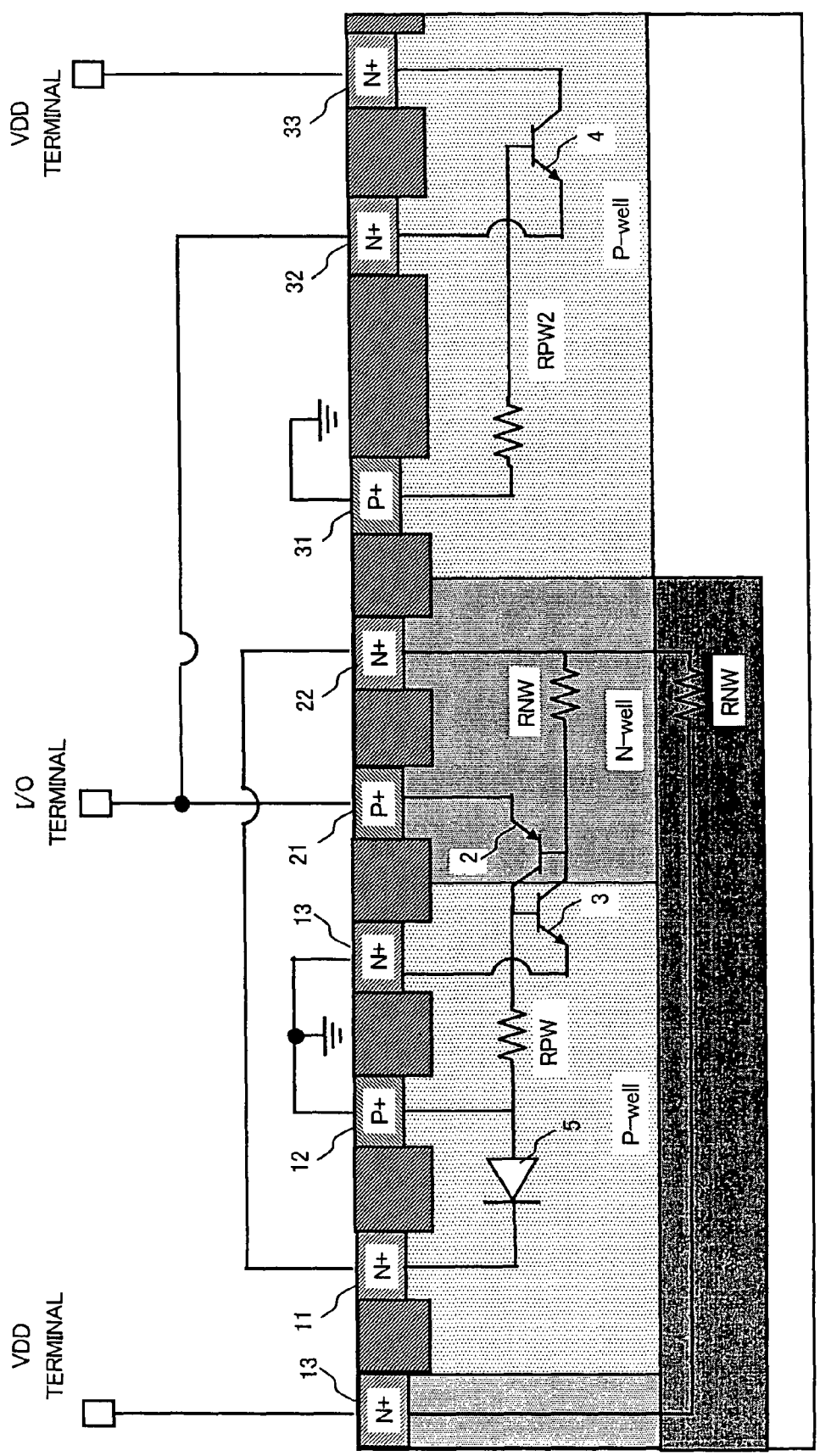
FIG. 22 is a sectional view of an electrostatic discharge protection circuit according to a modified example of the second embodiment.

FIG. 21 is a sectional view of an example of the electrostatic discharge protection device 1a where resistance values of the resistor RNW and the resistor RPW are set substantially large. As shown in FIG. 21, in the electrostatic discharge protection device 1a of this example, a distance between the emitter region and the base region is larger than that in the electrostatic discharge protection device 1 of the first embodiment. Thus, a length of the N-well region 20 formed between the emitter region and the base region is increased, so resistance values of the resistor RNW and the resistor RPW increase. Further, if a resistance value of the parasitic diode in the PNP transistor 2 is increased, the VDD terminal connected to the base of the PNP transistor may be connected to an N-type impurity diffusion layer in the other N well region on the semiconductor substrate and connected to the base through the deep N-well layer for separating the P-well region from the P-type substrate. FIG. 22 is a sectional view of the thus-structured device.

Figure 23:
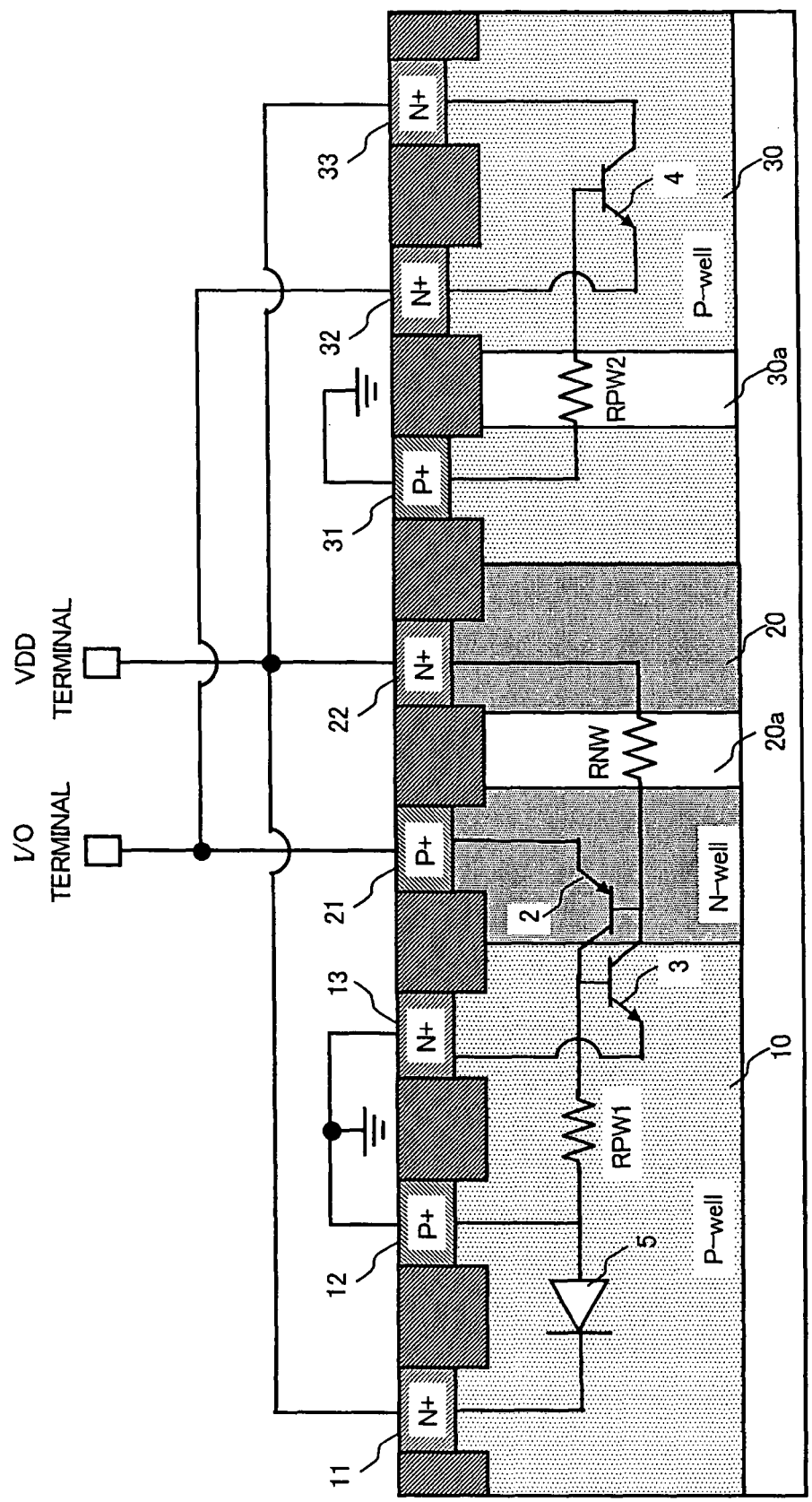
FIG. 23 is a sectional view of the electrostatic discharge protection circuit according to the modified example of the second embodiment.

Further, FIG. 23 is a sectional view of a first modified example of the second embodiment. In the electrostatic discharge protection device 1a of the first modified example of the second embodiment, a distance of the emitter region and the base region is the same as that of the first embodiment. In the first modified example of the second embodiment, a well region having a low impurity concentration is formed in a region between the collector region and the base region. The well region with the low impurity concentration is formed of a semiconductor having the same conductivity type as that of its surrounding well regions. A resistance value of the well region with the low impurity concentration is larger than that of the surrounding well regions. Thus, the resistance value of the resistor RNW and resistor RPW can be increased by forming the well region with the low impurity concentration.

Figure 24:
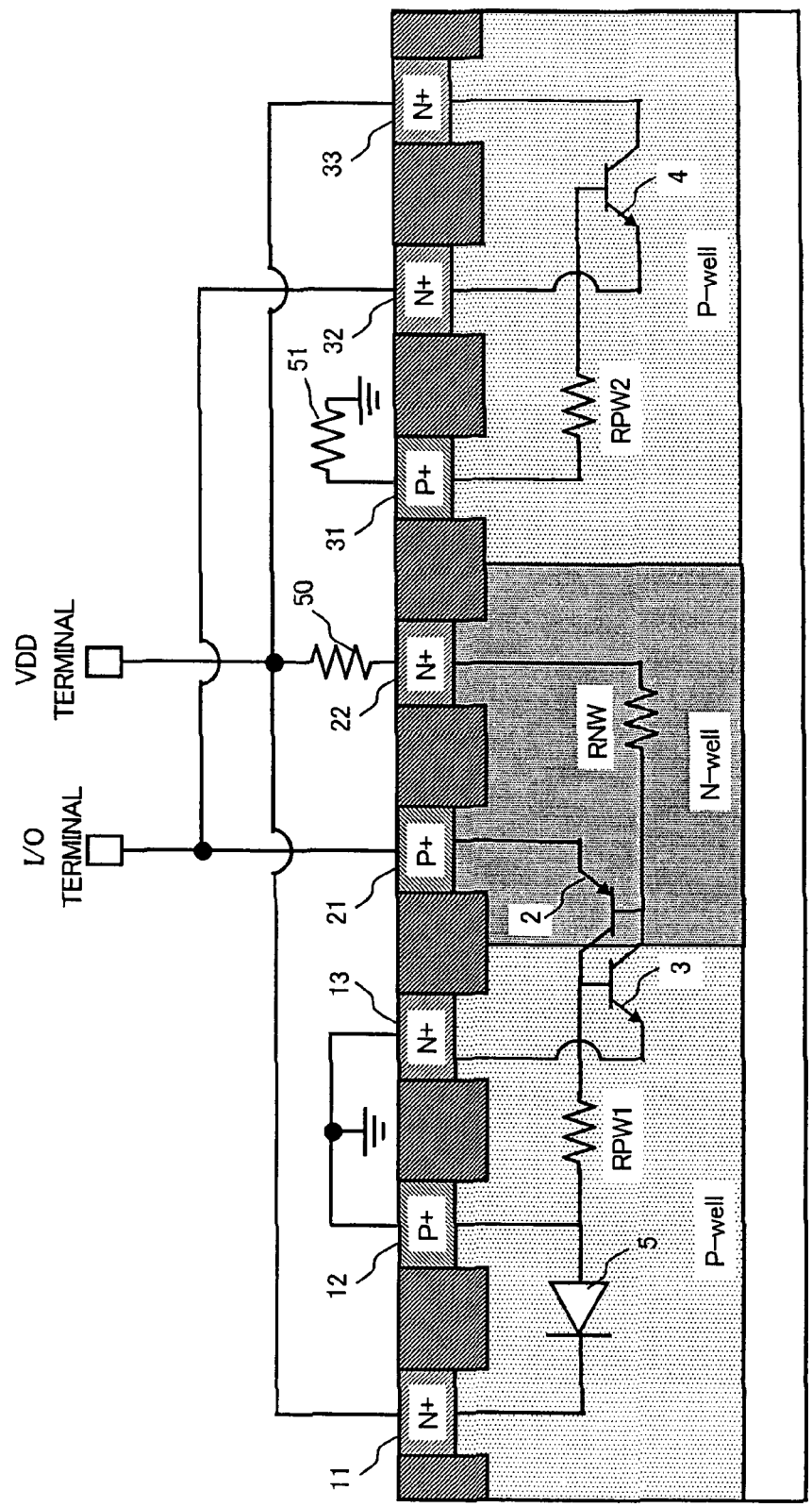
FIG. 24 is a sectional view of the electrostatic discharge protection circuit according to the modified example of the second embodiment.
Figure 25:
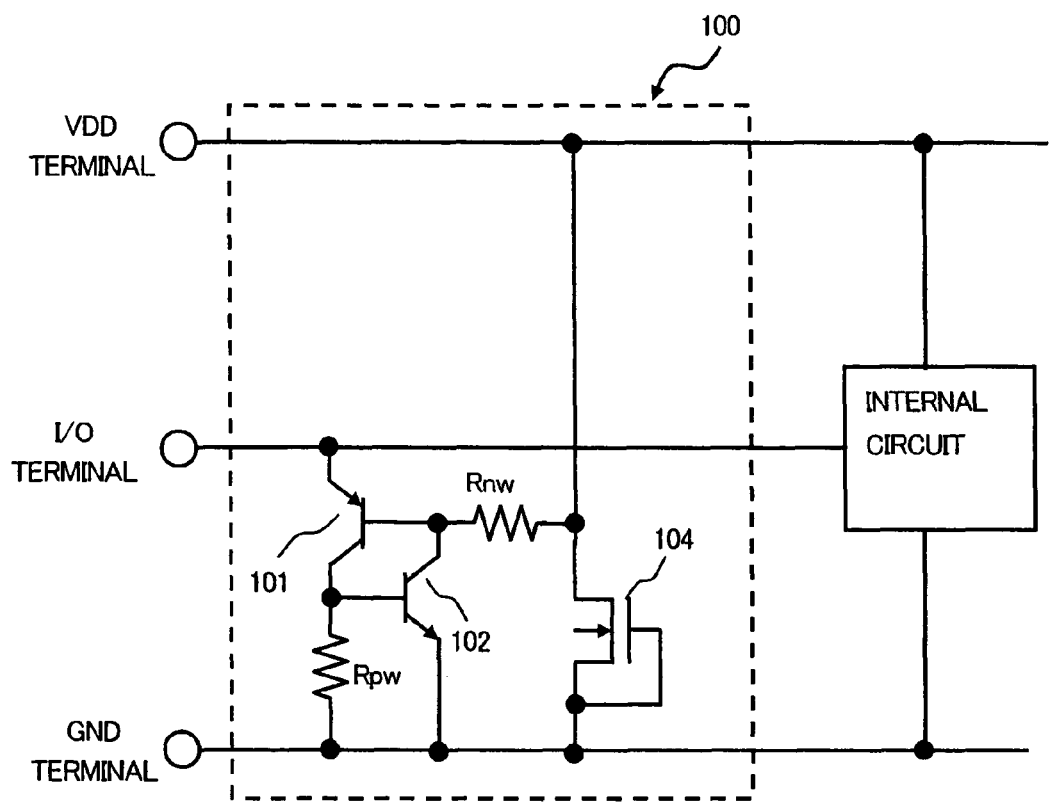
FIG. 25 is a circuit diagram of an electrostatic discharge protection circuit of the related art.

FIG. 24 is a sectional view of a second modified example of the second embodiment. The electrostatic discharge protection device 1a of the first modified example of the second embodiment has the same structure as that of the electrostatic discharge protection device 1 of the first embodiment except that a resistor is inserted between the base region and a terminal connected with the base region. The resistor is made of, for example, polysilicon. Further, the resistor is formed independently of the NPN transistor 3 and the PNP transistor 2. The resistor that is formed this way independently of the transistor, making it possible to process a line after the completion of manufacturing the semiconductor device and change resistance values of the resistor RNW and resistor RPW.

As set forth above in detail, according to the electrostatic discharge protection circuit and method of the above embodiments, an internal circuit can be protected with reliability irrespective of whether positive or negative electrostatic charges are impressed to a power supply terminal side or GND terminal side. In addition, a surge current is discharged through the turn-on operation of the thyristor or the snap back operation of the transistor, so a large amount of current can flow compared with the case of discharging a surge current through the broken-down parasitic diode of the transistor. As a result, the semiconductor device can be protected against breakdown.

Incidentally, the above embodiments and modified examples may be used in combination.

It is apparent that the present invention is not limited to the above embodiment but may be modified and changed without departing from the scope and spirit of the invention.

What is claimed is:

1. An electrostatic discharge protection circuit, comprising:
   a first bipolar transistor including one terminal connected with a first power supply terminal, another terminal connected with an input/output terminal, and a control terminal connected with a second power supply terminal; and
   a thyristor including one terminal connected with the input/output terminal, another terminal connected with the second power supply terminal, and a control terminal connected with the first power supply terminal,
   wherein the first bipolar transistor is formed in a first conductivity type well, and a region of the other terminal of the first bipolar transistor, which is connected with the input/output terminal includes a second-conductivity-type first diffusion region, and a second-conductivity-type second diffusion region formed entirely below the second-conductivity-type first diffusion region, the second conductivity-type second diffusion region having an impurity concentration less than an impurity concentration of the second-conductivity-type first diffusion region.

2. The electrostatic discharge protection circuit according to claim 1, wherein the thyristor includes:
   a second bipolar transistor including one terminal connected with the input/output terminal, another terminal connected with the second power supply terminal, and a control terminal connected with a trigger element and the first power supply terminal; and
   a third bipolar transistor including one terminal connected with the second power supply terminal, the other terminal connected with the control terminal of the second bipolar transistor, and a control terminal connected with the second power supply terminal.

3. The electrostatic discharge protection circuit according to claim 2, wherein the first bipolar transistor is formed in a first conductivity type well, and a region of the other terminal of the first bipolar transistor, which is connected with the input/output terminal includes a second-conductivity-type first diffusion region, and a second-conductivity-type second diffusion region with an impurity concentration less than an impurity concentration of the first diffusion region.

4. The electrostatic discharge protection circuit according to claim 2, wherein the second bipolar transistor is formed in a second conductivity type well, and a region of the other terminal of the second bipolar transistor, which is connected with the input/output terminal includes a first-conductivity-type third diffusion region, and a first-conductivity-type fourth diffusion region with an impurity concentration less than an impurity concentration of the third diffusion region.

5. The electrostatic discharge protection circuit according to claim 1, wherein the thyristor comprises:
a second bipolar transistor including one terminal connected with the input/output terminal, the other terminal connected with the second power supply terminal, and a control terminal connected with a trigger element and the first power supply terminal.

6. The electrostatic discharge protection circuit according to claim 5, wherein the first bipolar transistor is formed in a first conductivity type well, and a region of the other terminal of the first bipolar transistor, which is connected with the input/output terminal includes a second-conductivity-type first diffusion region, and a second-conductivity-type second diffusion region with an impurity concentration less than an impurity concentration of the first diffusion region.

7. The electrostatic discharge protection circuit according to claim 1, wherein the thyristor comprises a second bipolar transistor including one terminal connected with the input/output terminal and a control terminal connected with a trigger element and the first power supply terminal, and
wherein the first bipolar transistor is formed in a first conductivity type well, and a region of the other terminal of the first bipolar transistor, which is connected with the input/output terminal includes a second-conductivity-type first diffusion region.

8. The electrostatic discharge protection circuit according to claim 1, wherein the second-conductivity-type second diffusion region is formed adjacent to and below the second-conductivity-type first diffusion region, and
wherein at least a portion of the second-conductivity-type first diffusion region is located inside the first conductivity type well.

9. The electrostatic discharge protection circuit according to claim 1, wherein the second-conductivity-type second diffusion region is formed deeper in the first conductivity type well than a first or second conductivity type region of the one terminal of the first bipolar transistor, and
wherein a portion of the second-conductivity-type second diffusion region is formed in the first conductivity type well.

10. The electrostatic discharge protection circuit according to claim 1, wherein the second-conductivity-type second diffusion region is formed deeper in the first conductivity type well than a first or second conductivity type region of the control terminal of the first bipolar transistor, and
wherein the first bipolar transistor comprises a predetermined parasitic diode formed between the other terminal and the control terminal.

11. An electrostatic discharge protection circuit, comprising:
a first bipolar transistor including one terminal connected with a first power supply terminal, the other terminal connected with an input/output terminal, and a control terminal connected with a second power supply terminal; and
a thyristor including one terminal connected with the input/output terminal, the other terminal connected with the second power supply terminal, and a control terminal connected with the first power supply terminal,
wherein the first bipolar transistor is formed in a first conductivity type well, and a buried region of the other terminal of the first bipolar transistor, which is connected with the input/output terminal includes a second-conductivity-type first diffusion region formed in an insulating region, and a second-conductivity-type second diffusion region with an impurity concentration less than an impurity concentration of the first diffusion region, the second-conductivity-type second diffusion region being formed at least in part in the first conductivity type well and positioned below the first diffusion region, and
wherein the first transistor comprises a predetermined parasitic diode.

12. The electrostatic discharge protection circuit according to claim 4, wherein an impurity concentration of the second-conductivity-type second diffusion region of the first bipolar transistor is set to adjust a breakdown voltage of a first parasitic diode formed in the first bipolar transistor, such that a voltage at which the thyristor is turned on is less than the breakdown voltage of the first parasitic diode.

13. The electrostatic discharge protection circuit according to claim 11, wherein an impurity concentration of the second-conductivity type second diffusion region of the first bipolar transistor is set to adjust a breakdown voltage of the predetermined parasitic diode formed in the first bipolar transistor, such that a voltage at which a continuity between a collector and emitter of the first bipolar transistor is ensured is less than the breakdown voltage of the predetermined parasitic diode.

14. The electrostatic discharge protection circuit according to claim 4, wherein the first-conductivity-type fourth diffusion region of the second bipolar transistor is formed below the first-conductivity-type third diffusion region.

15. The electrostatic discharge protection circuit according to claim 1, wherein the second power supply terminal comprises a ground potential terminal.

* * * * *